(12) United States Patent
Bhattacharyya

(10) Patent No.: US 7,432,562 B2
(45) Date of Patent: Oct. 7, 2008

(54) SRAM DEVICES, AND ELECTRONIC SYSTEMS COMPRISING SRAM DEVICES

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 220 days.

(21) Appl. No.: 11/398,216

(22) Filed: Apr. 4, 2006

(65) Prior Publication Data

US 2006/0175649 A1 Aug. 10, 2006

Related U.S. Application Data

(62) Division of application No. 10/454,304, filed on Jun. 3, 2003, now Pat. No. 7,183,611.

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .................. 257/393; 257/903; 257/904; 257/E21.661

(58) Field of Classification Search ................ 257/206, 257/379–381, 393, 903–904, E21.661
See application file for complete search history.

(56) References Cited

U.S. PATENT DOCUMENTS

| | | | |
|---|---|---|---|
| 4,764,480 A | 8/1988 | Vora | |
| 5,348,903 A | 9/1994 | Pfiester et al. | |
| 5,352,916 A | 10/1994 | Kiyono et al. | |
| 5,401,670 A | 3/1995 | Yen | |
| 5,836,007 A | 11/1998 | Clinton et al. | |
| 5,891,244 A | 4/1999 | Kim et al. | |
| 5,956,591 A | 9/1999 | Fulford, Jr. | |
| 6,037,198 A | 3/2000 | Park et al. | |
| 6,059,895 A | 5/2000 | Chu et al. | |
| 6,204,608 B1 | 3/2001 | Song et al. | |
| 6,278,186 B1 | 8/2001 | Lowther et al. | |
| 6,326,667 B1 | 12/2001 | Sugiyama et al. | |
| 6,410,371 B1 | 6/2002 | Yu et al. | |
| 6,424,011 B1 | 7/2002 | Assaderaghi et al. | |
| 6,479,905 B1 | 11/2002 | Song | |
| 6,559,021 B2 | 5/2003 | Houghton et al. | |

(Continued)

OTHER PUBLICATIONS

Ono, K. et al., "Analysis of Current-Voltage Characteristics in Polysilicon TFTs for LCDs", IEDM Tech. Digest, 1988, pp. 256-259.

(Continued)

Primary Examiner—Thien F Tran
(74) Attorney, Agent, or Firm—Wells St. John P.S.

(57) ABSTRACT

The invention includes SRAM constructions comprising at least one transistor device having an active region extending into a crystalline layer comprising Si/Ge. A majority of the active region within the crystalline layer is within a single crystal of the crystalline layer, and in particular aspects an entirety of the active region within the crystalline layer is within a single crystal of the crystalline layer. The SRAM constructions can be formed in semiconductor on insulator assemblies, and such assemblies can be supported by a diverse range of substrates, including, for example, glass, semiconductor substrates, metal, insulative materials, and plastics. The invention also includes electronic systems comprising SRAM constructions.

16 Claims, 17 Drawing Sheets

U.S. PATENT DOCUMENTS

| | | | |
|---|---|---|---|
| 6,593,624 | B2 | 7/2003 | Walker |
| 6,613,628 | B2 | 9/2003 | Zheng et al. |
| 6,649,980 | B2 | 11/2003 | Noguchi |
| 6,674,100 | B2 | 1/2004 | Kubo et al. |
| 6,703,265 | B2 | 3/2004 | Asami et al. |
| 6,713,810 | B1 | 3/2004 | Bhattacharyya |
| 6,723,541 | B2 | 4/2004 | Sugii et al. |
| 6,759,712 | B2 | 7/2004 | Bhattacharyya |
| 6,768,156 | B1 | 7/2004 | Bhattacharyya |
| 6,800,892 | B2 | 10/2004 | Bhattacharyya |
| 6,812,504 | B2 | 11/2004 | Bhattacharyya |
| 6,845,034 | B2 | 1/2005 | Bhattacharyya |
| 6,873,015 | B2 | 3/2005 | Bhattacharyya |
| 6,882,010 | B2 | 4/2005 | Bhattacharyya |
| 6,888,750 | B2 | 5/2005 | Walker |
| 6,900,667 | B2 | 5/2005 | Bhattacharyya |
| 6,998,683 | B2 | 2/2006 | Bhattacharyya |
| 7,026,690 | B2 | 4/2006 | Bhattacharyya |
| 7,042,052 | B2 | 5/2006 | Bhattacharyya |
| 2003/0030091 | A1 | 2/2003 | Bulsara et al. |
| 2003/0052334 | A1 | 3/2003 | Lee et al. |

OTHER PUBLICATIONS

Yamauchi, N. et al., "Drastically Improved Performance in Poly-Si TFTs with Channel Dimensions Comparable to Grain Size", IEDM Tech. Digest, 1989, pp. 353-356.

King, T. et al, "A Low-Temperature ($\leq$550° C.) Silicon-Germanium MOS Thin-Film Transistor Technology for Large-Area Electronics", IEDM Tech. Digest, 1991, pp. 567-570.

Kuriyama, H. et al., "High Mobility Poly-Si TFT by a New Excimer Laser Annealing Method for Large Area Electronics", IEDM Tech. Digest, 1991, pp. 563-566.

Jeon, J. et al., "A New Poly-Si TFT with Selectively Doped Channel Fabricated by Novel Excimer Laser Annealing", IEDM Tech. Digest, 2000, pp. 213-216.

Kim, C.H. et al., "A New High -Performance Poly-Si TFT by Simple Excimer Laser Annealing on Selectively Floating a-Si Layer", IEDM Tech. Digest, 2001, pp. 751-754.

Hara, A. et al, "Selective Single-Crystalline-Silicon Growth at the Pre-Defined Active Regions of TFTs on a Glass by a Scanning CW Layer Irradiation", IEDM Tech. Digest, 2000, pp. 209-212.

Hara, A. et al., "High Performance Poly-Si TFTs on a Glass by a Stable Scanning CW Laser Lateral Crystallization", IEDM Tech. Digest, 2001, pp. 747-750.

Jagar, S. et al., "Single Grain Thin-Film-Transistor (TFT) with SOI CMOS Performance Formed by Metal-Induced-Lateral-Crystallization", IEDM Tech. Digest, 1999, p. 293-296.

Gu, J. et al., "High Performance Sub-100 nm Si Thin-Film Transistors by Pattern-Controlled Crystallization of Thin Channel Layer and High Temperature Annealing", DRC Conference Digest, 2002, pp. 49-50.

Kesan, V. et al., "High Performance 0.25 μm p-MOSFETs with Silicon- Germanium Channels for 300K and 77K Operation", IEDM Tech. Digest, 1991, pp. 25-28.

Garone, P.M. et al., "Mobility Enhancement and Quantum Mechanical Modeling in $Ge_xSi_{1-x}$ Channel MOSFETs from 90 to 300K", IEDM Tech. Digest, 1991, pp. 29-32.

Feder, B.J., "I.B.M. Finds Way to Speed Up Chips", The New York Times, Jun. 8, 2001, reprinted from http://www.nytimes.com/2001/06/08 /technology/08BLUE.html, 2 pgs.

Rim, K. et al., "Strained Si NMOSFET's for High Performance CMOS Technology", 2001 Sympos. on VLSI Tech. Digest of Technical Papers, p. 59-60.

Li, P. et al., "Design of High Speed Si/SiGe Heterojunction Complementary MOSFETs with Reduced Short-Channel Effects", Natl. Central University, ChungLi, Taiwan, ROC, Aug. 2001, Contract No. NSC 89-2215-E-008-049, National Science Council of Taiwan., pp. 1, 9.

Ernst, T. et al., "Fabrication of a Novel Strained SiGe:C-channel Planar 55 nm nMOSFET for High-Performance CMOS", 2002 Sympos. on VLSI Tech. Digest of Technical Papers, pp. 92-93.

Rim, K. et al., "Characteristics and Device Design of Sub-100 nm Strained SiN- and PMOSFETs", 2002 Sympos. on VLSI Tech. Digest of Technical Papers, pp. 98-99.

Belford, R.E. et al., "Performance-Augmented CMOS Using Back-End Uniaxial Strain", DRC Conf. Digest, 2002, pp. 41-42.

Shima, M. et al., "<100> Channel Strained-SiGe p-MOSFET with Enhanced Hole Mobility and Lower Parasitic Resistance", 2002 Sympos. on VLSI Tech. Digest of Technical Papers, pp. 94-95.

Nayfeh, H.M. et al., "Electron Inversion Layer Mobility in Strained-Si n-MOSFET's with High Channel Doping Concentration Achieved by Ion Implantation", DRC Conf. Digest, 2002, pp. 43-44.

Bae, G.J. et al., "A Novel SiGe-Inserted SOI Structure for High Performance PDSOI CMOSFET", IEDM Tech. Digest, 2000, pp. 667-670.

Cheng, Z. et al., "SiGe-on-Insulator (SGOI): Substrate Preparation and MOSFET Fabrication for Electron Mobility Evaluation" and conference outline, MIT Microsystems, Tech. Labs, Cambridge, MA, 2001 IEEE Internatl. SOI Conf., Oct. 2001, pp. 13-14, 3-pg. outline.

Huang, L.J. et al., "Carrier Mobility Enhancement in Strained Si-on-Insulator Fabricated by Wafer Bonding", 2001 Sympos. on VLSI Tech. Digest of Technical Papers, pp. 57-58.

Mizuno, T. et al., "High Performance CMOS Operation of Strained-SOI MOSFETs Using Thin Film SiGe-on-Insulator Substrate", 2002 Sympos. on VLSI Tech. Digest of Technical Papers, p. 106-107.

Tezuka, T. et al., "High-Performance Strained Si-on-Insulator MOSFETs by Novel Fabrication Processes Utilizing Ge-Condensation Technique", 2002 VLSI Tech. Digest of Technical Papers, pp. 96-97.

Takagi, S., "Strained-Si- and SiGe-on-Insulator (Strained SOI and SGOI) MOSFETs for High Performance/Low Power CMOS Application", DRC Conf. Digest, 2002, pp. 37-40.

"IBM Builds World's Fastest Communications Microchip", Reuters U.S. Company News, Feb. 25, 2002, reprinted from http://activequote300.fidelity.com/rtrnews/_individual_n.../..., 1 pg.

Markoff, J., "I.B.M. Circuits are Now Faster and Reduce Use of Power", The New York Times, Feb. 25, 2002, reprinted Mar. 20, 2002 from http://story.news.yahoo.com/ news?tmpl=story&u=/nyt/20020225/..., 1 pg.

Park, J.S. et al., "Normal Incident SiGe/Si Multiple Quantum Well Infrared Detector", IEDM Tech. Digest. 1991, pp. 749-752.

Current, M.I. et al., "Atomic-Layer Cleaving with $Si_xGe_y$ Strain Layers for Fabrication of Si and Ge-Rich SOI Device Layers", 2001 IEEE Internatl. SOI Conf. Oct. 2001, pp. 11-12.

Bhattacharyya, A., "The Role of Microelectronic Integration in Environmental Control: A Perspective", Mat. Res. Soc. Symp. Proc. vol. 344, 1994, pp. 281-293.

Myers, S.M. et al., "Deuterium Interactions in Oxygen-Implanted Copper", J. Appl. Phys., vol. 65(1), Jan. 1, 1989, p. 311-321.

Saggio, M. et al., "Innovative Localized Lifetime Control in High-Speed IGBT's", IEEE Elec. Dev. Lett., V. 18, No. 7, Jul. 1997, pp. 333-335.

Lu, N.C.C. et al., "A Buried-Trench DRAM Cell Using a Self-Aligned Epitaxy Over Trench Technology", IEDM Tech. Digest, 1988, pp. 588-591.

Yamada, T. et al., "Spread Source/Drain (SSD) MOSFET Using Selective Silicon Growth for 64Mbit DRAMSs", IEDM Tech. Digest, 1989, pp. 35-38.

van Meer, H. et al., "Ultra-Thin Film Fully-Depleted SOI CMOS with Raised G/S/D Device Architecture for Sub-100 nm Applications", 2001 IEEE Internatl. SOI Conf. Oct. 2001, pp. 45-46.

Yamanaka, T. et al., "A 25 μm², New Poly-Si PMOS Load (PPL) SRAM Cell Having Excellent Soft Error Immunity", IEDM Aug. 1988, pp. 48-51.

Yuzuriha, K. et al., "A Large Cell-Ratio and Low Node Leak 16M-bit SRAM Cell Using Ring-Gate Transistors", IEDM Sep. 1991, pp. 485-488.

Itabashi, K. et al., "A Split Wordline Cell for 16Mb SRAM Using Polysilicon Sidewall Contacts", IEDM Sep. 1991, pp. 477-480.

Ohkubo, H. et al., "16Mbit SRAM Cell Technologies for 2.0V Operation", IEDM Sep. 1991, pp. 481-484.

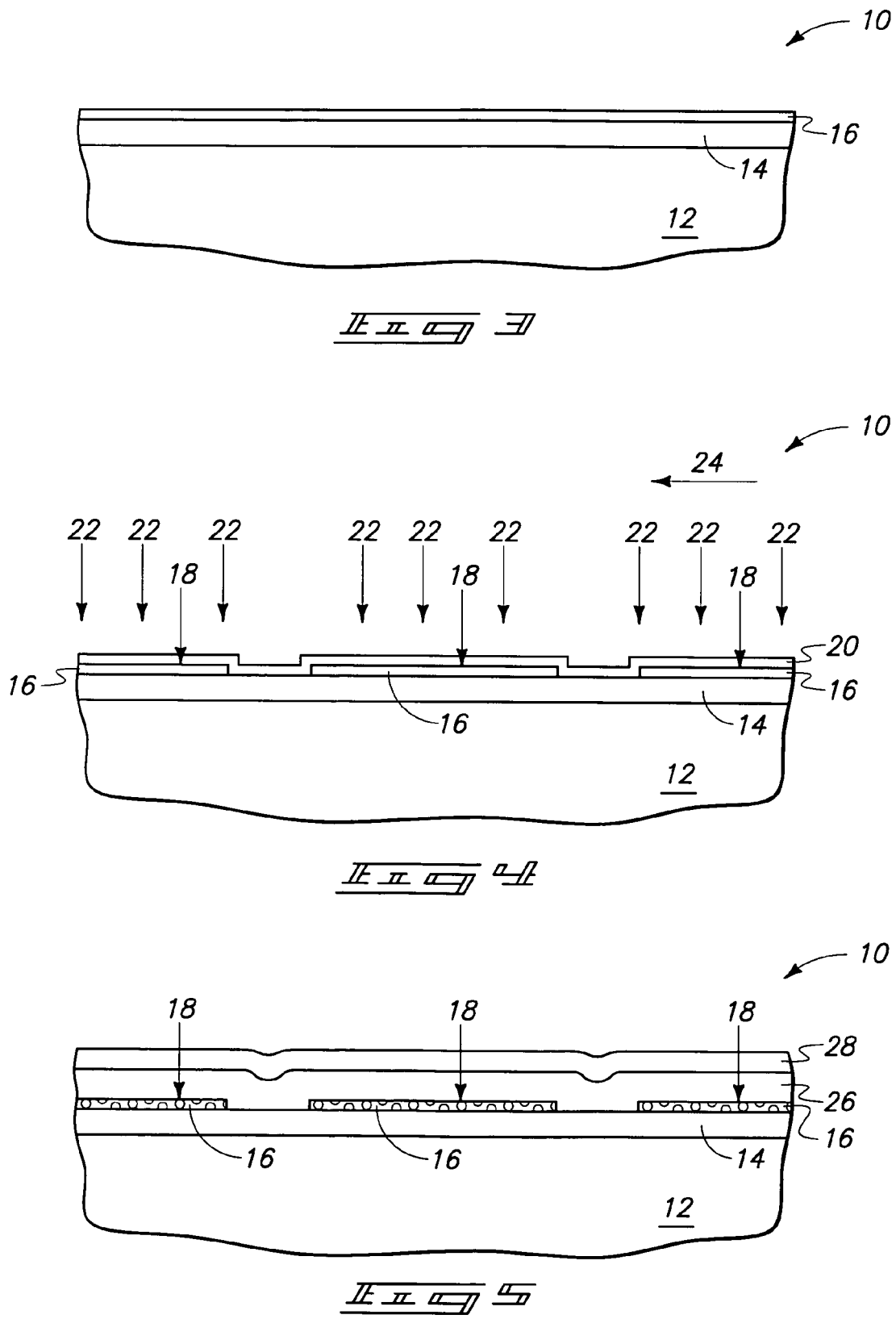

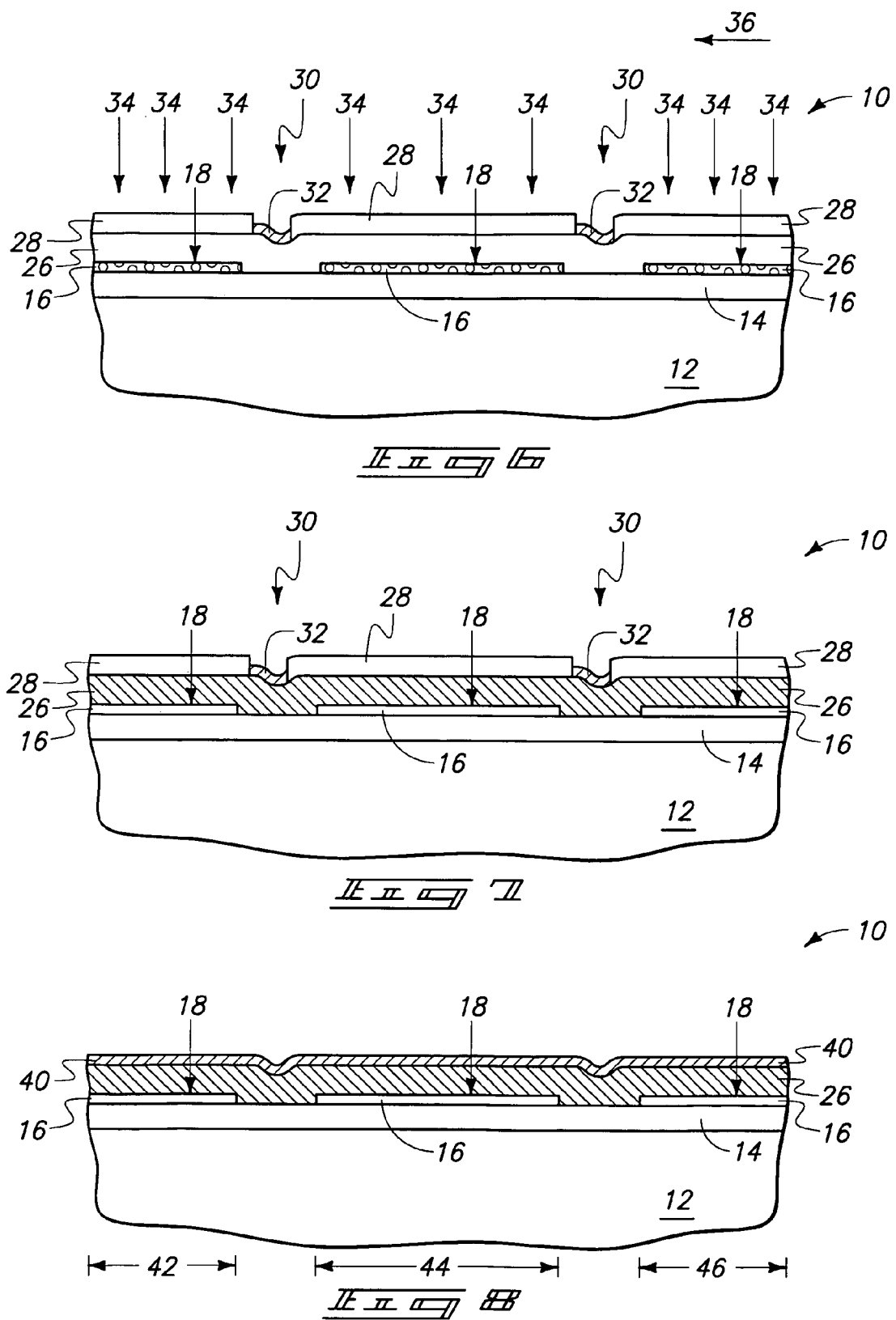

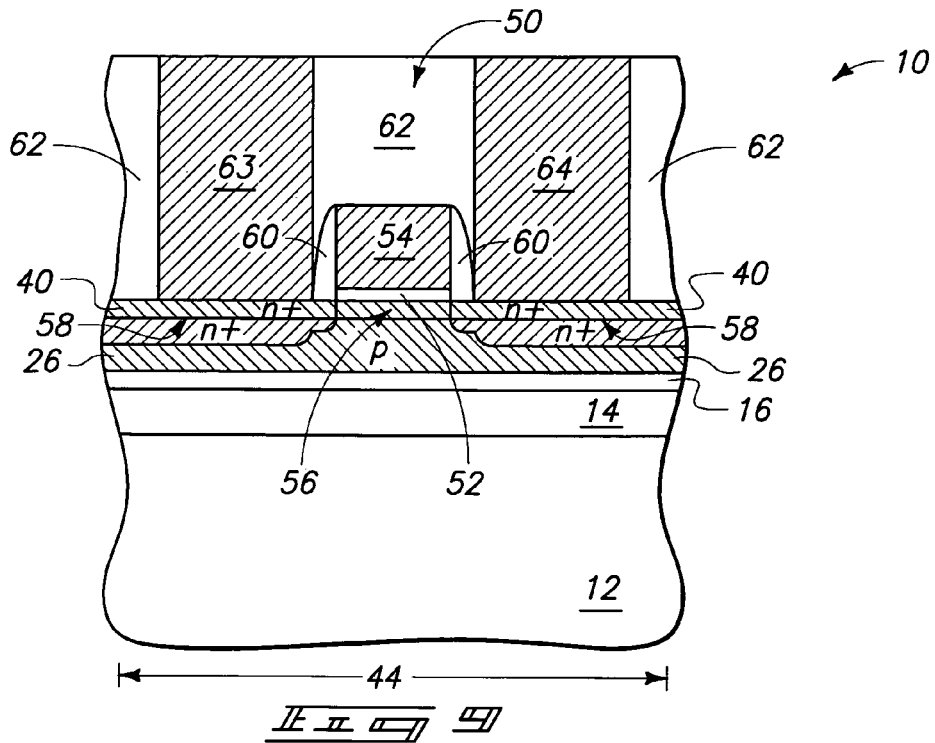
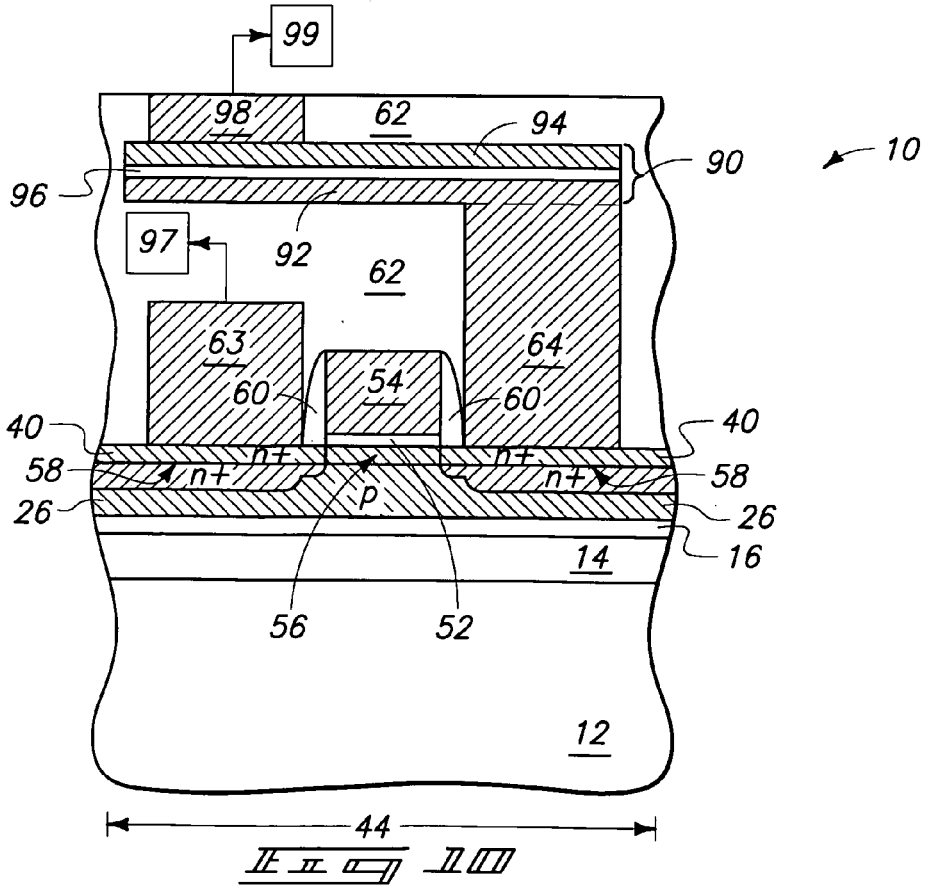

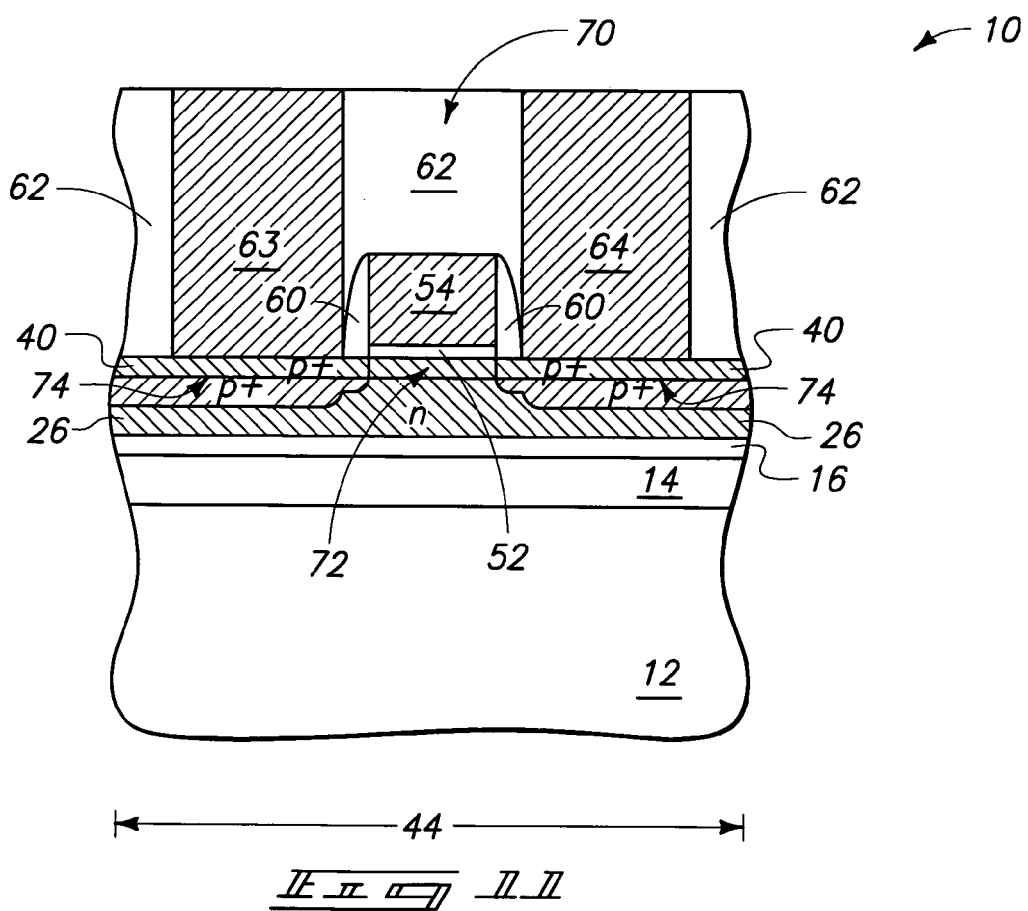

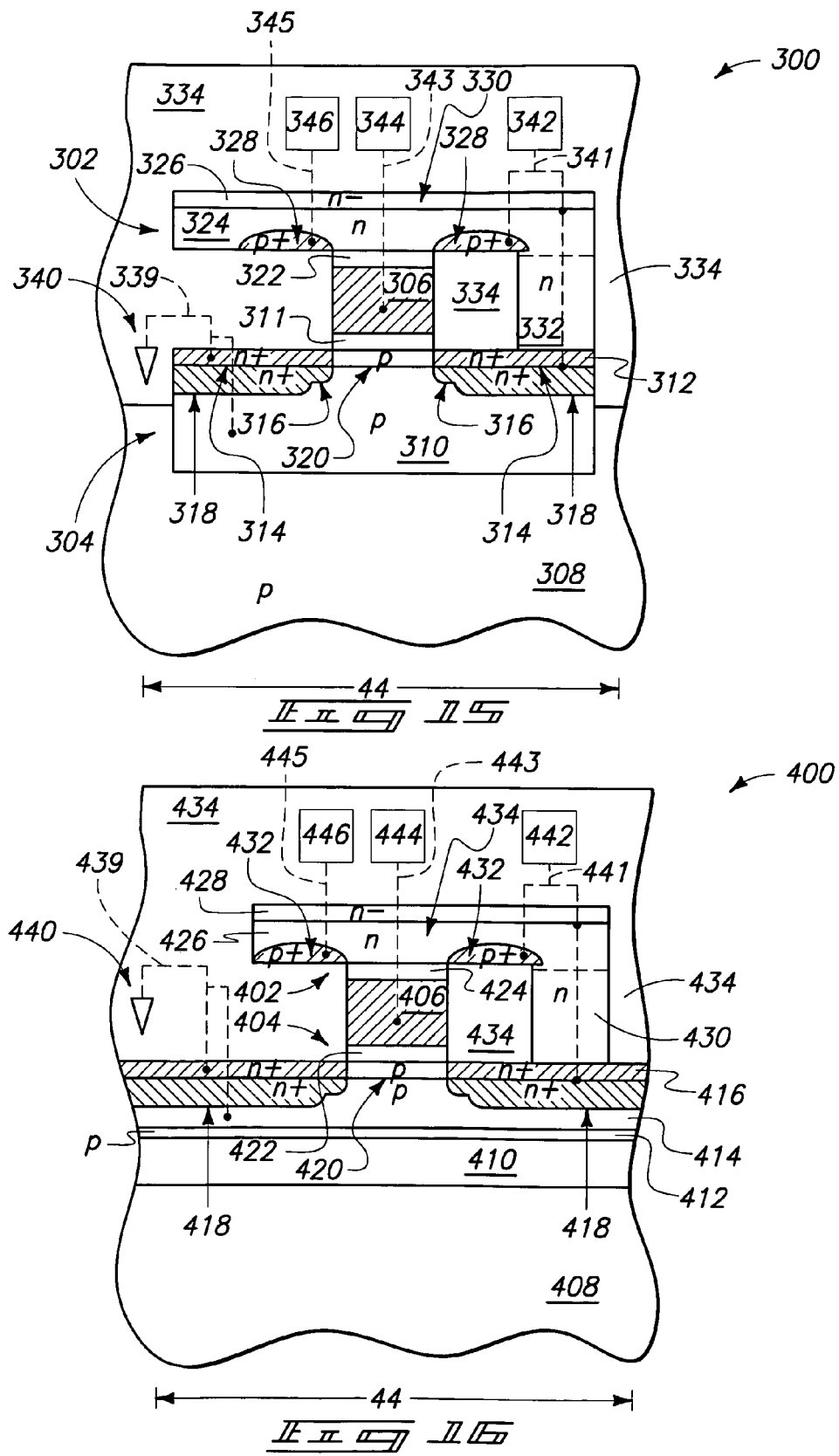

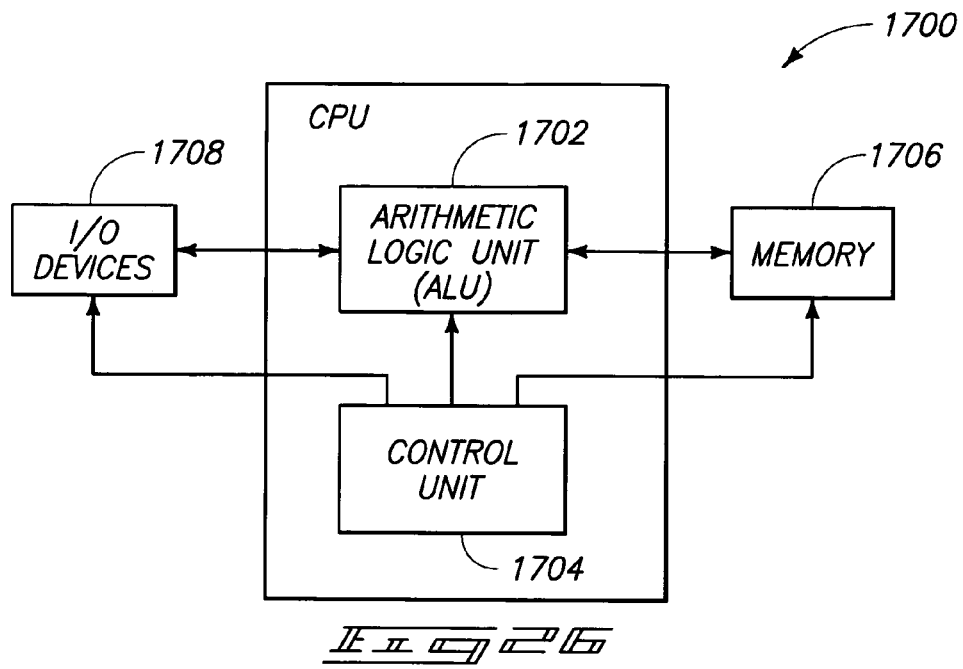
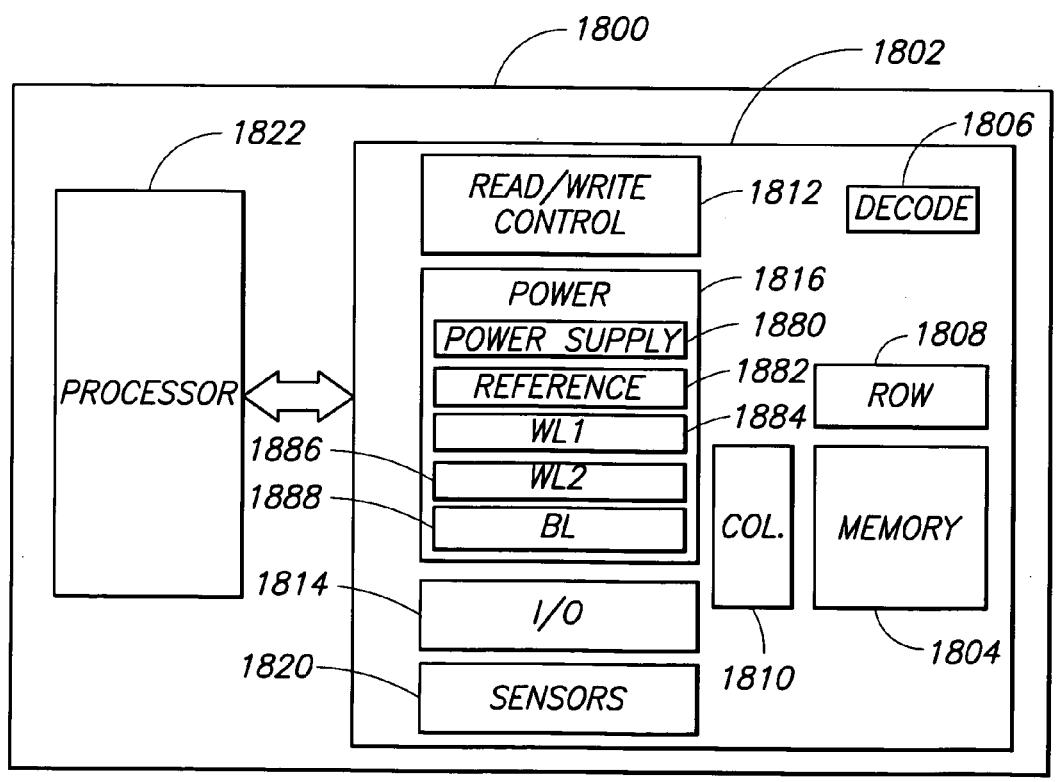

SRAM DEVICES, AND ELECTRONIC SYSTEMS COMPRISING SRAM DEVICES

RELATED PATENT DATA

This patent resulted from a divisional of U.S. patent application Ser. No. 10/454,304, filed Jun. 3, 2003, which issued as U.S. Pat. No. 7,183,611 on Feb. 27, 2007; and which is hereby incorporated by reference.

TECHNICAL FIELD

The invention pertains to static random access memory (SRAM) devices, and also pertains to electrical systems comprising SRAM devices.

BACKGROUND OF THE INVENTION

SOI technology differs from traditional bulk semiconductor technologies in that the active semiconductor material of SOI technologies is typically much thinner than that utilized in bulk technologies. The active semiconductor material of SOI technologies will typically be formed as a thin film over an insulating material (typically oxide), with exemplary thicknesses of the semiconductor film being less than or equal to 2000 Å. In contrast, bulk semiconductor material will typically have a thickness of at least about 200 microns. The thin semiconductor of SOI technology can allow higher performance and lower power consumption to be achieved in integrated circuits than can be achieved with similar circuits utilizing bulk materials.

An exemplary integrated circuit device that can be formed utilizing SOI technologies is a so-called thin film transistor (TFT), with the term "thin film" referring to the thin semiconductor film of the SOI construction. In particular aspects, the semiconductor material of the SOI construction can be silicon, and in such aspects the TFTs can be fabricated using recrystallized amorphous silicon or polycrystalline silicon. The silicon can be supported by an electrically insulative material (such as silicon dioxide), which in turn is supported by an appropriate substrate. Exemplary substrate materials include glass, bulk silicon and metal-oxides (such as, for example, $Al_2O_3$). If the semiconductor material comprises silicon, the term SOI is occasionally utilized to refer to a silicon-on-insulator construction, rather than the more general concept of a semiconductor-on-insulator construction. However, it is to be understood that in the context of this disclosure the term SOI refers to semiconductor-on-insulator constructions. Accordingly, the semiconductor material of an SOI construction referred to in the context of this disclosure can comprise other semiconductive materials in addition to, or alternatively to, silicon; including, for example, germanium.

A problem associated with conventional TFT constructions is that grain boundaries and defects can limit carrier mobilities. Accordingly, carrier mobilities are frequently nearly an order of magnitude lower than they would be in bulk semiconductor devices. High voltage (and therefore high power consumption), and large areas are utilized for the TFTs, and the TFTs exhibit limited performance. TFTs thus have limited commercial application and currently are utilized primarily for large area electronics.

Various efforts have been made to improve carrier mobility of TFTs. Some improvement is obtained for devices in which silicon is the semiconductor material by utilizing a thermal anneal for grain growth following silicon ion implantation and hydrogen passivation of grain boundaries (see, for example, Yamauchi, N. et al., "Drastically Improved Performance in Poly-Si TFTs with Channel Dimensions Comparable to Grain Size", IEDM Tech. Digest, 1989, pp. 353-356). Improvements have also been made in devices in which a combination of silicon and germanium is the semiconductor material by optimizing the germanium and hydrogen content of silicon/germanium films (see, for example, King, T. J. et al, "A Low-Temperature (<=550° C.) Silicon-Germanium MOS TFT Technology for Large-Area Electronics", IEDM Tech. Digest, 1991, pp. 567-570).

Investigations have shown that nucleation, direction of solidification, and grain growth of silicon crystals can be controlled selectively and preferentially by excimer laser annealing, as well as by lateral scanning continuous wave laser irradiation/anneal for recrystallization (see, for example, Kuriyama, H. et al., "High Mobility Poly-Si TFT by a New Excimer Laser Annealing Method for Large Area Electronics", IEDM Tech. Digest, 1991, pp. 563-566; Jeon, J. H. et al., "A New Poly-Si TFT with Selectively Doped Channel Fabricated by Novel Excimer Laser Annealing", IEDM Tech. Digest, 2000, pp. 213-216; Kim, C. H. et al., "A New High-Performance Poly-Si TFT by Simple Excimer Laser Annealing on Selectively Floating a Si Layer", IEDM Tech. Digest, 2001, pp. 753-756; Hara, A. et al, "Selective Single-Crystalline-Silicon Growth at the Pre-Defined Active Regions of TFTs on a Glass by a Scanning CW Layer Irradiation", IEDM Tech. Digest, 2000, pp. 209-212; and Hara, A. et al., "High Performance Poly-Si TFTs on a Glass by a Stable Scanning CW Laser Lateral Crystallization", IEDM Tech. Digest, 2001, pp. 747-750). Such techniques have allowed relatively defect-free large crystals to be grown, with resulting TFTs shown to exhibit carrier mobility over 300 $cm^2$/V-second.

Another technique which has shown promise for improving carrier mobility is metal-induced lateral recrystallization (MILC), which can be utilized in conjunction with an appropriate high temperature anneal (see, for example, Jagar, S. et al., "Single Grain TFT with SOI CMOS Performance Formed by Metal-Induced-Lateral-Crystallization", IEDM Tech. Digest, 1999, p. 293-296; and Gu, J. et al., "High Performance Sub-100 nm Si TFT by Pattern-Controlled Crystallization of Thin Channel Layer and High Temperature Annealing", DRC Conference Digest, 2002, pp. 49-50). A suitable post-recrystallization anneal for improving the film quality within silicon recrystallized by MILC is accomplished by exposing recrystallized material to a temperature of from about 850° C. to about 900° C. under an inert ambient (with a suitable ambient comprising, for example, $N_2$). MILC can allow nearly single crystal silicon grains to be formed in predefined amorphous-silicon islands for device channel regions. Nickel-induced-lateral-recrystallization can allow device properties to approach those of single crystal silicon.

The carrier mobility of a transistor channel region can be significantly enhanced if the channel region is made of a semiconductor material having a strained crystalline lattice (such as, for example, a silicon/germanium material having a strained lattice, or a silicon material having a strained lattice) formed over a semiconductor material having a relaxed lattice (such as, for example, a silicon/germanium material having a relaxed crystalline lattice). (See, for example, Rim, K. et al., "Strained Si NMOSFETs for High Performance CMOS Technology", VLSI Tech. Digest, 2001, p. 59-60; Cheng, Z. et al., "SiGe-On-Insulator (SGOI) Substrate Preparation and MOSFET Fabrication for Electron Mobility Evaluation" 2001 IEEE SOI Conference Digest, October 2001, pp. 13-14; Huang, L. J. et al., "Carrier Mobility Enhancement in Strained Si-on-Insulator Fabricated by Wafer Bonding", VLSI Tech. Digest, 2001, pp. 57-58; and Mizuno, T. et al., "High Performance CMOS Operation of Strained-SOI MOSFETs Using Thin Film SiGe-on-Insulator Substrate", VLSI Tech. Digest, 2002, p. 106-107.)

The terms "relaxed crystalline lattice" and "strained crystalline lattice" are utilized to refer to crystalline lattices which are within a defined lattice configuration for the semiconductor material, or perturbed from the defined lattice configuration, respectively. In applications in which the relaxed lattice material comprises silicon/germanium having a germanium concentration of from 10% to 60%, mobility enhancements of 110% for electrons and 60-80% for holes can be accomplished by utilizing a strained lattice material in combination with the relaxed lattice material (see for example, Rim, K. et al., "Characteristics and Device Design of Sub-100 nm Strained SiN and PMOSFETs", VLSI Tech. Digest, 2002, pp. 98-99; and Huang, L. J. et al., "Carrier Mobility Enhancement in Strained Si-on-Insulator Fabricated by Wafer Bonding", VLSI Tech. Digest, 2001, pp. 57-58).

Performance enhancements of standard field effect transistor devices are becoming limited with progressive lithographic scaling in conventional applications. Accordingly, strained-lattice-channeled field effect transistors on relaxed silicon/germanium offers an opportunity to enhance device performance beyond that achieved through conventional lithographic scaling. IBM recently announced the world's fastest communications chip following the approach of utilizing a strained crystalline lattice over a relaxed crystalline lattice (see, for example, "IBM Builds World's Fastest Communications Microchip", Reuters U.S. Company News, Feb. 25, 2002; and Markoff, J., "IBM Circuits are Now Faster and Reduce Use of Power", The New York Times, Feb. 25, 2002).

Although various techniques have been developed for substantially controlling nucleation and grain growth processes of semiconductor materials, grain orientation control is lacking. Further, the post-anneal treatment utilized in conjunction with MILC can be unsuitable in applications in which a low thermal budget is desired. Among the advantages of the invention described below is that such can allow substantial control of crystal grain orientation within a semiconductor material, while lowering thermal budget requirements relative to conventional methods. Additionally, the quality of the grown crystal formed from a semiconductor material can be improved relative to that of conventional methods.

The methods described herein can be utilized in numerous applications, and in specific applications are utilized in forming static random access memory (SRAM) devices.

FIG. 1 shows a prior art six transistor static read/write memory cell 710 such as is typically used in high-density SRAMs. A static memory cell is characterized by operation in one of two mutually-exclusive and self-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of zero, while a high or set output voltage represents a binary value of one.

Static memory cell 710 generally comprises first and second inverters 712 and 714 which are cross-coupled to form a bistable flip-flop. Inverters 712 and 714 are formed by n-channel driver transistors 716 and 717, and p-channel load transistors 718 and 719. In a standard bulk silicon implementation, driver transistors 716 and 717 are typically n-channel metal oxide silicon field effect transistors (MOSFETs) formed in an underlying silicon semiconductor substrate. P-channel load transistors 718 and 719 are typically arranged in a planar bulk implementation, are formed to extend in an n-well adjacent the n-channel FETS, and are interconnected to the n-channel FETs in accordance with standard CMOS technology.

The source regions of driver transistors 716 and 717 are tied to a low reference or circuit supply voltage 715 (labeled $V_{SS}$ in FIG. 1), which is typically referred to as "ground." Load transistors 718 and 719 are connected in series between a high reference or circuit supply voltage 711 (labeled $V_{CC}$ in FIG. 1) and the drains of the corresponding driver transistors 716 and 717, respectively. The gates of load transistors 718 and 719 are connected to the gates of the corresponding driver transistors 716 and 717 through interconnects 725 and 727.

Inverter 712 has an inverter output 720 formed at the common node 731. Similarly, inverter 714 has an inverter output 722 at the common node 733. Inverter 712 has an inverter input 725 at the common gate node, with the input 725 being connected to an interconnect 724. Inverter 714 has an inverter input 727 at the common gate node, with the input 727 being connected to an interconnect 726.

The inputs and outputs of inverters 712 and 714 are cross-coupled to form a flip-flop having a pair of complementary two-state outputs. Specifically, inverter output node 731 is cross-coupled to inverter input node 727, and inverter output node 733 is cross-coupled to inverter input node 725. In this configuration, inverter outputs 720 and 722 form the complementary two-state outputs of the flip-flop.

Node 731 represents the common node of electrical interconnection between source/drain regions of CMOS transistor pairs 716 and 718 of inverter 712. Similarly, node 733 represents the common node of electrical interconnection between the source/drain regions of transistor pairs 717 and 719 of inverter 714. Nodes 731 and 733 can be referred to as common node contacts. Similarly, nodes 725 and 727 can be referred to as common gate contact nodes of the respective invertors 712 and 714.

A memory flip-flop, such as that described, typically forms one memory element of an integrated array of static memory elements. A plurality of access transistors, such as access transistors 730 and 732, are used to selectively address and access individual memory elements within the array. Access transistor 730 has one active terminal connected to cross-coupled inverter output 720. Access transistor 732 has one active terminal connected to cross-coupled inverter output 722. A plurality of complementary column line pairs, such as the single pair of complementary column lines 734 and 736 shown, are connected to the remaining active terminals of access transistors 730 and 732, respectively, at the shown nodes 713 and 721. Lines 734 and 736 can be referred to as a bit line and an inverted bit line (bit-bar) respectively. A row line (also referred to as a wordline) 738 is connected to the gate nodes of access transistors 730 and 732, at 718 and 719, respectively.

Reading static memory cell 710 involves activating row line 738 to connect inverter outputs 720 and 722 to column lines 734 and 736. Writing to static memory cell 710 involves first placing selected complementary logic voltages on column lines 734 and 736, and then activating row line 738 to connect those logic voltages to inverter outputs 720 and 722. This forces the outputs to the selected logic state "one" or "zero", which will be maintained as long as power is supplied to the memory cell, or until the memory cell is reprogrammed.

FIG. 2 shows an alternative four transistor, dual wordline, prior art static read/write memory cell 750 such as is typically used in high-density static random access memories. Static memory cell 750 comprises n-channel pull down (driver) transistors 780 and 782 having drains respectively connected to pull up load elements or resistors 784 and 786. Transistors 780 and 782 are typically n-channel metal oxide silicon field effect transistors (NMOSFETs) formed in an underlying silicon semiconductor substrate.

The source regions of transistors 780 and 782 are tied to a low reference or circuit supply voltage, labeled $V_{SS}$ and typically referred to as "ground." Resistors 784 and 786 are respectively connected in series between a high reference or circuit supply voltage, labeled $V_{CC}$, and the drains of the corresponding transistors 780 and 782. The common node 772 of the resistor(786)-transistor (782) pair is connected to the gate of transistor 780 by line 776 for cross-coupling. Similarly, the common node 768 of the resistor (784)-transistor (780) pair is connected to the gate of transistor 782 for cross-coupling by line 774. Thus is formed a flip-flop having a pair of complementary two-state outputs.

A memory flip-flop, such as that of FIG. 2, typically forms one memory element of an integrated array of static memory elements. A plurality of access transistors, such as access transistors 790 and 792, are used to selectively address and access individual memory elements within the array. Access transistor 790 has one active terminal connected to the common node 768. Access transistor 792 has one active terminal connected to the common node 772. A plurality of complementary column line pairs, such as the single pair of complementary column lines 752 and 754 shown, are connected to the remaining active terminals of access transistors 790 and 792, respectively. A row line 756 is connected to the gates of access transistors 790 and 792.

Reading static memory cell 750 involves activating row line 756 to connect outputs 768 and 772 to column lines 752 and 754. Writing to static memory cell 750 involves first placing selected complementary logic voltages on column lines 752 and 754, and then activating row line 756 to connect those logic voltages to output nodes 768 and 772. This forces the outputs to the selected logic state "one" or "zero", which will be maintained as long as power is supplied to the memory cell, or until the memory cell is reprogrammed. An advantage of the four-transistor SRAM cell is lower power consumption while an advantage of the six-transistor SRAM cell is higher performance.

A static memory cell is said to be bistable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The two possible output voltages produced by a static memory cell correspond generally to upper and lower circuit supply voltages. Intermediate output voltages, between the upper and lower circuit supply voltages, generally do not occur except for during brief periods of memory cell power-up and during transitions from one operating state to the other operating state.

The operation of a static memory cell is in contrast to other types of memory cells such as dynamic cells which do not have stable operating states. A dynamic memory cell can be programmed to store a voltage which represents one of two binary values, but requires periodic reprogramming or "refreshing" to maintain this voltage for more than very short time periods.

A dynamic memory cell has no internal feedback to maintain a stable output voltage. Without refreshing, the output of a dynamic memory cell will drift toward intermediate or indeterminate voltages, resulting in loss of data. Dynamic memory cells are used in spite of this limitation because of the significantly greater packaging densities which can be attained. For instance, a dynamic memory cell can be fabricated with a single MOSFET transistor, rather than the four or more transistors typically required in a static memory cell. Because of the significantly different architectural arrangements and functional requirements of static and dynamic memory cells and circuits, static memory design has developed along generally different paths than has the design of dynamic memories. An SRAM cell is typically ten to twenty times larger than a DRAM cell and provides five to ten times greater performance than the DRAM counterpart, when such devices are built on conventional silicon single crystal substrates. It would be desirable to provide high speed yet dense SRAM memory cell constructions over a versatile substrate, such as, for example, glass, to extend application flexibility and to reduce cost.

SUMMARY OF THE INVENTION

In one aspect, the invention encompasses an SRAM construction. The construction includes at least one transistor device having an active region extending into a crystalline layer comprising Si/Ge. A majority of the active region within the crystalline layer is within a single crystal of the crystalline layer. In particular aspects, the SRAM construction comprises two resistors in combination with four transistor devices having active regions extending into crystalline Si/Ge. In yet other aspects the SRAM construction comprises six transistor devices having active regions extending into the crystalline Si/Ge. The SRAM construction can be associated with a semiconductor on insulator (SOI) assembly, and in particular aspects the SOI assembly can be formed over any of a diverse range of substrates, including, for example, one or more of glass, aluminum oxide, silicon dioxide, semiconductive materials, and plastic.

In one aspect, the invention encompasses SRAM constructions which include one or more CMOS inverters sharing a common gate between NFET devices and PFET devices.

In particular aspects, the invention includes electronic systems comprising SRAM constructions.

BRIEF DESCRIPTION OF THE DRAWINGS

Preferred embodiments of the invention are described below with reference to the following accompanying drawings.

FIG. 3 is a diagrammatic, cross-sectional view of a fragment of a semiconductor construction shown at a preliminary stage of an exemplary process of the present invention.

FIG. 4 is a view of the FIG. 3 fragment shown at a processing stage subsequent to that of FIG. 3.

FIG. 5 is a view of the FIG. 3 fragment shown at a processing stage subsequent to that of FIG. 4.

FIG. 6 is a view of the FIG. 3 fragment shown at a processing stage subsequent to that of FIG. 5.

FIG. 7 is a view of the FIG. 3 fragment shown at a processing stage subsequent to that of FIG. 6.

FIG. 8 is a view of the FIG. 3 fragment shown at a processing stage subsequent to that of FIG. 7.

FIG. 9 is an expanded region of the FIG. 8 fragment shown at a processing stage subsequent to that of FIG. 8 in accordance with an exemplary embodiment of the present invention, and shows an n-channel device.

FIG. 10 is a view of the FIG. 9 fragment shown at a processing stage subsequent to that of FIG. 9.

FIG. 11 is a view of an expanded region of FIG. 8 shown at a processing stage subsequent to that of FIG. 8 in accordance with an alternative embodiment relative to that of FIG. 9, and shows a p-channel device.

FIG. 15 is a diagrammatic, cross-sectional view of a semiconductor fragment illustrating another exemplary CMOS inverter construction in accordance with an aspect of the present invention.

FIG. 16 is a diagrammatic, cross-sectional view of a semiconductor fragment illustrating another exemplary CMOS inverter construction.

FIG. 26 is a high-level block diagram of an electronic system according to an exemplary aspect of the present invention.

FIG. 27 is a simplified block diagram of an exemplary memory device according to an aspect of the present invention.

DETAILED DESCRIPTION OF THE PREFERRED EMBODIMENTS

Figure 1:
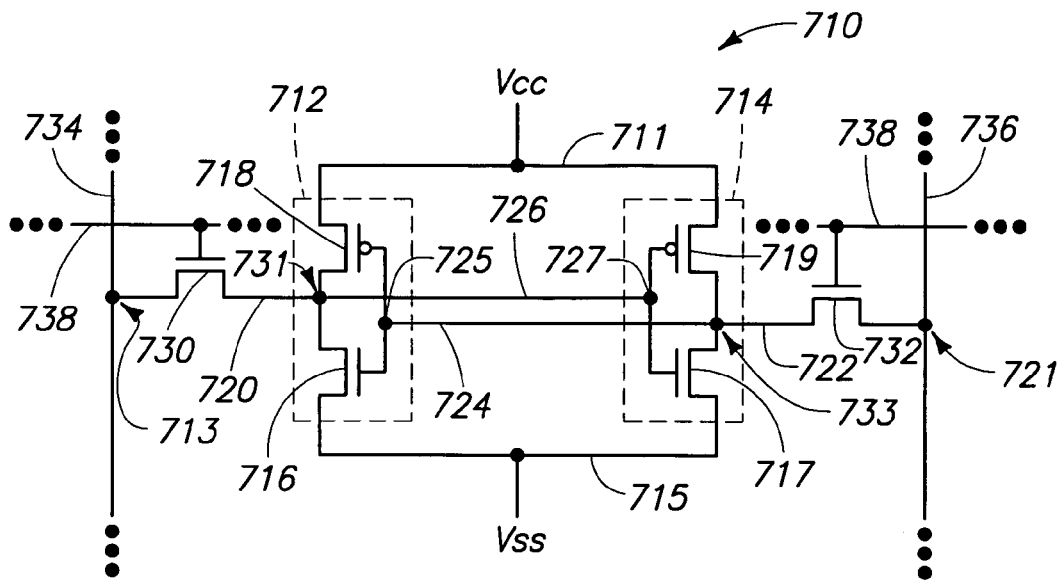
FIG. 1 illustrates a circuit schematic of a prior art SRAM cell.

The invention pertains to SRAM devices. Prior to the discussion of the exemplary SRAM devices of the invention, processing sequences for forming and utilizing preferred Si/Ge materials are described with reference to FIGS. 3-17.

Referring to FIG. 3, a fragment of a semiconductor construction 10 is illustrated at a preliminary processing stage. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Construction 10 comprises a base (or substrate) 12 and an insulator layer 14 over the base. Base 12 can comprise, for example, one or more of glass, aluminum oxide, silicon dioxide, metal and plastic. Additionally, and/or alternatively, base 12 can comprise a semiconductor material, such as, for example, a silicon wafer.

Layer 14 comprises an electrically insulative material, and in particular applications can comprise, consist essentially of, or consist of silicon dioxide. In the shown construction, insulator layer 14 is in physical contact with base 12. It is to be understood, however, that there can be intervening materials and layers provided between base 12 and layer 14 in other aspects of the invention (not shown). For example, a chemically passive thermally stable material, such as silicon nitride ($Si_3N_4$), can be incorporated between base 12 and layer 14. Layer 14 can have a thickness of, for example, from about 200 nanometers to about 500 nanometers, and can be referred to as a buffer layer.

Layer 14 preferably has a planarized upper surface. The planarized upper surface can be formed by, for example, chemical-mechanical polishing.

A layer 16 of semiconductive material is provided over insulator layer 14. In the shown embodiment, semiconductive material layer 16 is formed in physical contact with insulator 14. Layer 16 can have a thickness of, for example, from about 5 nanometers to about 10 nanometers. Layer 16 can, for example, comprise, consist essentially of, or consist of either doped or undoped silicon. If layer 16 comprises, consists essentially of, or consists of doped silicon, the dopant concentration can be from about $10^{14}$ atoms/cm$^3$ to about $10^{20}$ atoms/cm$^3$. The dopant can be either n-type or p-type, or a combination of n-type and p-type.

The silicon utilized in layer 16 can be either polycrystalline silicon or amorphous silicon at the processing stage of FIG. 3. It can be advantageous to utilize amorphous silicon in that it is typically easier to deposit a uniform layer of amorphous silicon than to deposit a uniform layer of polycrystalline silicon.

Referring to FIG. 4, material 16 is patterned into a plurality of discrete islands (or blocks) 18. Such can be accomplished utilizing, for example, photoresist (not shown) and photolithographic processing, together with an appropriate etch of material 16.

A capping layer 20 is provided over islands 18 and over portions of layer 14 exposed between the islands. Layer 20 can, for example, comprise, consist essentially of, or consist of one or both of silicon dioxide and silicon. Layer 20 can also comprise multiple layers of silicon dioxide, stress-free silicon oxynitride, and silicon.

After formation of capping layer 20, small voids (nanovoids) and small crystals are formed in the islands 18. The formation of the voids and crystals can be accomplished by ion implanting helium 22 into material 16 and subsequently exposing material 16 to laser-emitted electromagnetic radiation. The helium can aid in formation of the nanovoids; and the nanovoids can in turn aid in crystallization and stress relief within the material 16 during exposure to the electromagnetic radiation. The helium can thus allow crystallization to occur at lower thermal budgets than can be achieved without the helium implantation. The helium is preferably implanted selectively into islands 18 and not into regions between the islands. The exposure of construction 10 to electromagnetic radiation can comprise subjecting the construction to scanned continuous wave laser irradiation while the construction is held at an appropriate elevated temperature (typically from about 300° C. to about 450° C.). The exposure to the electromagnetic radiation can complete formation of single crystal seeds within islands 18. The laser irradiation is scanned along an axis 24 in the exemplary shown embodiment.

The capping layer 20 discussed previously is optional, but can beneficially assist in retaining helium within islands 18 and/or preventing undesirable impurity contamination during the treatment with the laser irradiation.

Referring to FIG. 5, islands 18 are illustrated after voids have been formed therein. Additionally, small crystals (not shown) have also been formed within islands 18 as discussed above.

Capping layer 20 (FIG. 4) is removed, and subsequently a layer 26 of semiconductive material is formed over islands 18. Layer 26 can comprise, consist essentially of, or consist of silicon and germanium; or alternatively can comprise, consist essentially of, or consist of doped silicon/germanium. The germanium concentration within layer 26 can be, for example, from about 10 atomic percent to about 60 atomic percent. In the shown embodiment, layer 26 physically contacts islands 18, and also physically contacts insulator layer 14 in gaps between the islands. Layer 26 can be formed to a thickness of, for example, from about 50 nanometers to about 100 nanometers, and can be formed utilizing a suitable deposition method, such as, for example, plasma-assisted chemical vapor deposition.

A capping layer 28 is formed over semiconductor layer 26. Capping layer 28 can comprise, for example, silicon dioxide. Alternatively, capping layer 28 can comprise, for example, a combination of silicon dioxide and stress-free silicon oxynitride. Capping layer 28 can protect a surface of layer 26 from particles and contaminants that could otherwise fall on layer 26. If the processing of construction 10 occurs in an environment in which particle formation and/or incorporation of contaminants is unlikely (for example, an ultrahigh vacuum environment), layer 28 can be eliminated from the process. Layer 28 is utilized in the patterning of a metal (discussed below). If layer 28 is eliminated from the process, other methods besides those discussed specifically herein can be utilized for patterning the metal.

Referring to FIG. 6, openings 30 are extended through capping layer 28 and to an upper surface of semiconductive material 26. Openings 30 can be formed by, for example, photolithographic processing to pattern a layer of photoresist (not shown) into a mask, followed by a suitable etch of layer 28 and subsequent removal of the photoresist mask.

A layer 32 of metal-containing material is provided within openings 30, and in physical contact with an upper surface of semiconductive material 26. Layer 32 can have a thickness of, for example, less than or equal to about 10 nanometers. The material of layer 32 can comprise, consist essentially of, or consist of, for example, nickel. Layer 32 can be formed by, for example, physical vapor deposition. Layer 32 can be formed to be within openings 30 and not over material 28 (as is illustrated in FIG. 6) by utilizing deposition conditions which selectively form metal-containing layer 32 on a surface of material 26 relative to a surface of material 28. Alternatively, material 32 can be deposited by a substantially non-selective process to form the material 32 over the surface of material 28 as well as over the surface of material 26 within openings 30, and subsequently material 32 can be selectively removed from over surfaces of material 28 while remaining within openings 30. Such selective removal can be accomplished by, for example, chemical-mechanical polishing, and/or by forming a photoresist mask (not shown) over the material 32 within openings 30, while leaving other portions of material 32 exposed, and subsequently removing such other portions to leave only the segments of material 32 within openings 30. The photoresist mask can then be removed.

Oxygen 34 is ion implanted through layers 26 and 28, and into layer 16 to oxidize the material of layer 16. For instance, if layer 16 consists of silicon, the oxygen can convert the silicon to silicon dioxide. Such swells the material of layer 16, and accordingly fills the nanovoids that had been formed earlier. The oxygen preferably only partially oxidizes layer 16, with the oxidation being sufficient to fill all, or at least substantially all, of the nanovoids; but leaving at least some of the seed crystals within layer 16 that had been formed with the laser irradiation discussed previously. In some aspects, the oxidation can convert a lower portion of material 16 to silicon dioxide while leaving an upper portion of material 16 as non-oxidized silicon.

The oxygen ion utilized as implant 34 can comprise, for example, oxygen ($O_2$) or ozone ($O_3$). The oxygen ion implant can occur before or after formation of openings 30 and provision of metal-containing layer 32.

Construction 10 is exposed to continuous wave laser irradiation while being held at an appropriate temperature (which can be, for example, from about 300° C. to about 450° C.; or in particular applications can be greater than or equal to 550° C.) to cause transformation of at least some of layer 26 to a crystalline form. The exposure to the laser irradiation comprises exposing the material of construction 10 to laser-emitted electromagnetic radiation scanned along a shown axis 36. Preferably, the axis 36 along which the laser irradiation is scanned is the same axis that was utilized for scanning of laser irradiation in the processing stage of FIG. 4.

The crystallization of material 26 (which can also be referred to as a recrystallization of the material) is induced utilizing metal-containing layer 32, and accordingly corresponds to an application of MILC. The MILC transforms material 26 to a crystalline form and the seed layer provides the crystallographic orientation while undergoing partial oxidation.

The crystal orientation within crystallized layer 26 can originate from the crystals initially formed in islands 18. Accordingly, crystal orientations formed within layer 26 can be controlled through control of the crystal orientations formed within the semiconductive material 16 of islands 18.

The oxidation of part of material 16 which was described previously can occur simultaneously with the MILC arising from continuous wave laser irradiation. Partial oxidation of seed layer 16 facilitates: (1) Ge enrichment into Si—Ge layer 26 (which improves carrier mobility); (2) stress-relief of Si—Ge layer 26; and (3) enhancement of recrystallization of Si—Ge layer 26. The crystallization of material 26 can be followed by an anneal of material 26 at a temperature of, for example, about 900° C. for a time of about 30 minutes, or by an appropriate rapid thermal anneal, to further ensure relaxed, defect-free crystallization of material 26. The annealing option can be dependent on the thermal stability of the material selected for substrate 12.

FIG. 7 shows construction 10 after the processing described above with reference to FIG. 6. Specifically, the voids that had been in material 16 are absent due to the oxidation of material 16. Also, semiconductive material 26 has been transformed into a crystalline material (illustrated diagrammatically by the cross-hatching of material 26 in FIG. 7). Crystalline material 26 can consist of a single large crystal, and accordingly can be monocrystalline. Alternatively, crystalline material 26 can be polycrystalline. If crystalline material 26 is polycrystalline, the crystals of the material will preferably be equal in size or larger than the blocks 18. In particular aspects, each crystal of the polycrystalline material can be about as large as one of the shown islands 18. Accordingly, the islands can be associated in a one-to-one correspondence with crystals of the polycrystalline material.

The shown metal layers 32 are effectively in a one-to-one relationship with islands 18, and such one-to-one correspondence of crystals to islands can occur during the MILC. Specifically, single crystals can be generated relative to each of islands 18 during the MILC process described with reference to FIG. 6. It is also noted, however, that although the metal layers 32 are shown in a one-to-one relationship with the islands in the cross-sectional views of FIGS. 6 and 7, the construction 10 comprising the shown fragment should be understood to extend three dimensionally. Accordingly, the islands 18 and metal layers 32 can extend in directions corresponding to locations into and out of the page relative to the shown cross-sectional view. There can be regions of the construction which are not shown where a metal layer overlaps with additional islands besides the shown islands.

Referring to FIG. 8, layers 28 and 32 (FIG. 7) are removed, and subsequently a layer 40 of crystalline semiconductive material is formed over layer 26. In typical applications, layer 26 will have a relaxed crystalline lattice and layer 40 will have a strained crystalline lattice. As discussed previously, layer 26 will typically comprise both silicon and germanium, with the germanium being present to a concentration of from about 10 atomic percent to about 60 atomic percent. Layer 40 can comprise, consist essentially of, or consist of either doped or undoped silicon; or alternatively can comprise, consist essentially of, or consist of either doped or undoped silicon/germanium. If layer 40 comprises silicon/germanium, the germanium content can be from about 10 atomic percent to about 60 atomic percent.

Strained lattice layer 40 can be formed by utilizing methods similar to those described in, for example, Huang, L. J. et al., "Carrier Mobility Enhancement in Strained Si-on-Insulator Fabricated by Wafer Bonding", VLSI Tech. Digest, 2001, pp. 57-58; and Cheng, Z. et al., "SiGe-On-Insulator (SGOI) Substrate Preparation and MOSFET Fabrication for Electron Mobility Evaluation" 2001 IEEE SOI Conference Digest, October 2001, pp. 13-14.

Strained lattice layer 40 can be large polycrystalline or monocrystalline. If strained lattice layer 40 is polycrystalline, the crystals of layer 40 can be large and in a one-to-one relationship with the large crystals of a polycrystalline relaxed crystalline layer 26. Strained lattice layer 40 is preferably monocrystalline over the individual blocks 18.

The strained crystalline lattice of layer 40 can improve mobility of carriers relative to the material 26 having a relaxed crystalline lattice. However, it is to be understood that layer 40 is optional in various aspects of the invention.

Each of islands 18 can be considered to be associated with a separate active region 42, 44 and 46. The active regions can be separated from one another by insulative material subsequently formed through layers 26 and 40 (not shown). For instance, a trenched isolation region can be formed through layers 26 and 40 by initially forming a trench extending through layers 26 and 40 to insulative material 14, and subsequently filling the trench with an appropriate insulative material such as, for example, silicon dioxide.

As discussed previously, crystalline material 26 can be a single crystal extending across an entirety of the construction 10 comprising the shown fragment, and accordingly extending across all of the shown active regions. Alternatively, crystalline material 26 can be polycrystalline. If crystalline material 26 is polycrystalline, the single crystals of the polycrystalline material will preferably be large enough so that only one single crystal extends across the majority of a given active region, and preferably so that only one single crystal extends across the entirety of a given active region. In other words, active region 42 will preferably comprise a single crystal of material 26, active region 44 will comprise a single crystal of the material, and active region 46 will comprise a single crystal of the material, with the single crystals being separate and discrete relative to one another.

FIG. 9 shows an expanded view of active region 44 at a processing stage subsequent to that of FIG. 8, and specifically shows a field effect transistor device 50 associated with active region 44 and supported by crystalline material 26.

Transistor device 50 comprises a dielectric material 52 formed over strained lattice 40, and a gate 54 formed over dielectric material 52. Dielectric material 52 typically comprises silicon dioxide, and gate 54 typically comprises a stack including an appropriate conductive material, such as, for example, conductively-doped silicon and/or metal.

A channel region 56 is beneath gate 54, and in the shown construction extends across strained crystalline lattice material 40. The channel region may also extend into relaxed crystalline lattice material 26 (as shown). Channel region 56 is doped with a p-type dopant.

Transistor construction 50 additionally comprises source/drain regions 58 which are separated from one another by channel region 56, and which are doped with n-type dopant to an n+concentration (typically, a concentration of at least $10^{21}$ atoms/cm$^3$). In the shown construction, source/drain regions 58 extend across strained lattice layer 40 and into relaxed lattice material 26. Although source/drain regions 58 are shown extending only partially through relaxed lattice layer 26, it is to be understood that the invention encompasses other embodiments (not shown) in which the source/drain regions extend all the way through relaxed material 26 and to material 16.

Channel region 56 and source/drain regions 58 can be formed by implanting the appropriate dopants into crystalline materials 26 and 40. The dopants can be activated by rapid thermal activation (RTA), which can aid in keeping the thermal budget low for fabrication of field effect transistor 50.

An active region of transistor device 50 extends across source/drain regions 58 and channel region 56. Preferably the majority of the portion of the active region within crystalline material 26 is associated with only one single crystal of material 26. More preferably an entirety of the portion of the active region within crystalline material 26 is associated with only one single crystal of material 26. Such can be accomplished by having material 26 be entirely monocrystalline. Alternatively, material 26 can be polycrystalline and comprise an individual single grain which accommodates the entire portion of the active region that is within material 26. The portion of strained lattice material 40 that is encompassed by the active region is preferably a single crystal, and can, in particular aspects, be considered an extension of the single crystal of the relaxed lattice material 26 of the active region.

Crystalline materials 40 and 26 can, together with any crystalline structures remaining in material 16, have a total thickness of less than or equal to about 2000 Å. Accordingly the crystalline material can correspond to a thin film formed over an insulative material. The insulative material can be considered to be insulative layer 14 alone, or a combination of insulative layer 14 and oxidized portions of material 16.

The transistor structure 50 of FIG. 9 corresponds to an n-type field effect transistor (NFET), and in such construction it can be advantageous to have strained crystalline material 40 consist of a strained silicon material having appropriate dopants therein. The strained silicon material can improve mobility of electrons through channel region 56, which can improve performance of the NFET device relative to a device lacking the strained silicon lattice. Although it can be preferred that strained lattice material 40 comprise silicon in an NFET device, it is to be understood that the strained lattice can also comprise other semiconductive materials. A strained silicon lattice can be formed by various methods. For instance, strained silicon could be developed by various means and lattice 40 could be created by lattice mismatch with other materials or by geometric conformal lattice straining on another substrate (mechanical stress).

As mentioned above, strained lattice 40 can comprise other materials alternatively to, or additionally to, silicon. The strained lattice can, for example, comprise a combination of silicon and germanium. There can be advantages to utilizing the strained crystalline lattice comprising silicon and germanium relative to structures lacking any strained lattice. However, it is generally most preferable if the strained lattice consists of silicon alone (or doped silicon), rather than a combination of silicon and germanium for an NFET device.

A pair of sidewall spacers 60 are shown formed along sidewalls of gate 54, and an insulative mass 62 is shown extending over gate 54 and material 40. Conductive interconnects 63 and 64 extend through the insulative mass 62 to electrically connect with source/drain regions 58. Interconnects 63 and 64 can be utilized for electrically connecting transistor construction 50 with other circuitry external to transistor construction 50. Such other circuitry can include, for example, a bitline and a capacitor in applications in which construction 50 is incorporated into dynamic random access memory (DRAM).

FIG. 10 shows construction 10 at a processing stage subsequent to that of FIG. 9, and shows a capacitor structure 90 formed over and in electrical contact with conductive interconnect 64. The shown capacitor structure extends across gate 54 and interconnect 63.

Capacitor construction 90 comprises a first capacitor electrode 92, a second capacitor electrode 94, and a dielectric material 96 between capacitor electrodes 92 and 94. Capacitor electrodes 92 and 94 can comprise any appropriate conductive material, including, for example, conductively-doped silicon. In particular aspects, electrodes 92 and 94 will each comprise n-type doped silicon, such as, for example, polycrystalline silicon doped to a concentration of at least about $10^{21}$ atoms/cm$^3$ with n-type dopant. In a particular aspect of the invention, electrode 92, conductive interconnect 64 and the source/drain region 58 electrically connected with interconnect 64 comprise, or consist of, n-type doped semiconductive material. Accordingly, n-type doped semiconductive material extends from the source/drain region, through the interconnect, and through the capacitor electrode.

Dielectric material 96 can comprise any suitable material, or combination of materials. Exemplary materials suitable for dielectric 106 are high dielectric constant materials including, for example, silicon nitride, aluminum oxide, $TiO_2$, $Ta_2O_5$, $ZrO_2$, etc.

The conductive interconnect 63 is in electrical connection with a bitline 97. Top capacitor electrode 94 is shown in electrical connection with an interconnect 98, which in turn connects with a reference voltage 99, which can, in particular aspects, be ground. The construction of FIG. 10 can be considered a DRAM cell, and such can be incorporated into an electronic system (such as, for example, a computer system) as a memory device.

FIG. 11 shows construction 10 at a processing stage subsequent to that of FIG. 8 and alternative to that described previously with reference to FIG. 9. In referring to FIG. 11, similar numbering will be used as is used above in describing FIG. 9, where appropriate.

A transistor construction 70 is shown in FIG. 11, and such construction differs from the construction 50 described above with reference to FIG. 9 in that construction 70 is a p-type field effect transistor (PFET) rather than the NFET of FIG. 9. Transistor device 70 comprises an n-type doped channel region 72 and p+ doped source/drain regions 74. In other words, the channel region and source/drain regions of transistor device 70 are oppositely doped relative to the channel region and source/drain regions described above with reference to the NFET device 50 of FIG. 9.

The strained crystalline lattice material 40 of the PFET device 70 can consist of appropriately doped silicon, or consist of appropriately doped silicon/germanium. It can be most advantageous if the strained crystalline lattice material 40 comprises appropriately doped silicon/germanium in a PFET construction, in that silicon/germanium can be a more effective carrier of holes with higher mobility than is silicon without germanium.

Devices similar to the transistor devices discussed above (NFET device 50 of FIG. 9, and PFET device 70 of FIG. 11) can be utilized in numerous constructions. Exemplary constructions are described in the FIGS. 12-23 that follow.

Figure 12:
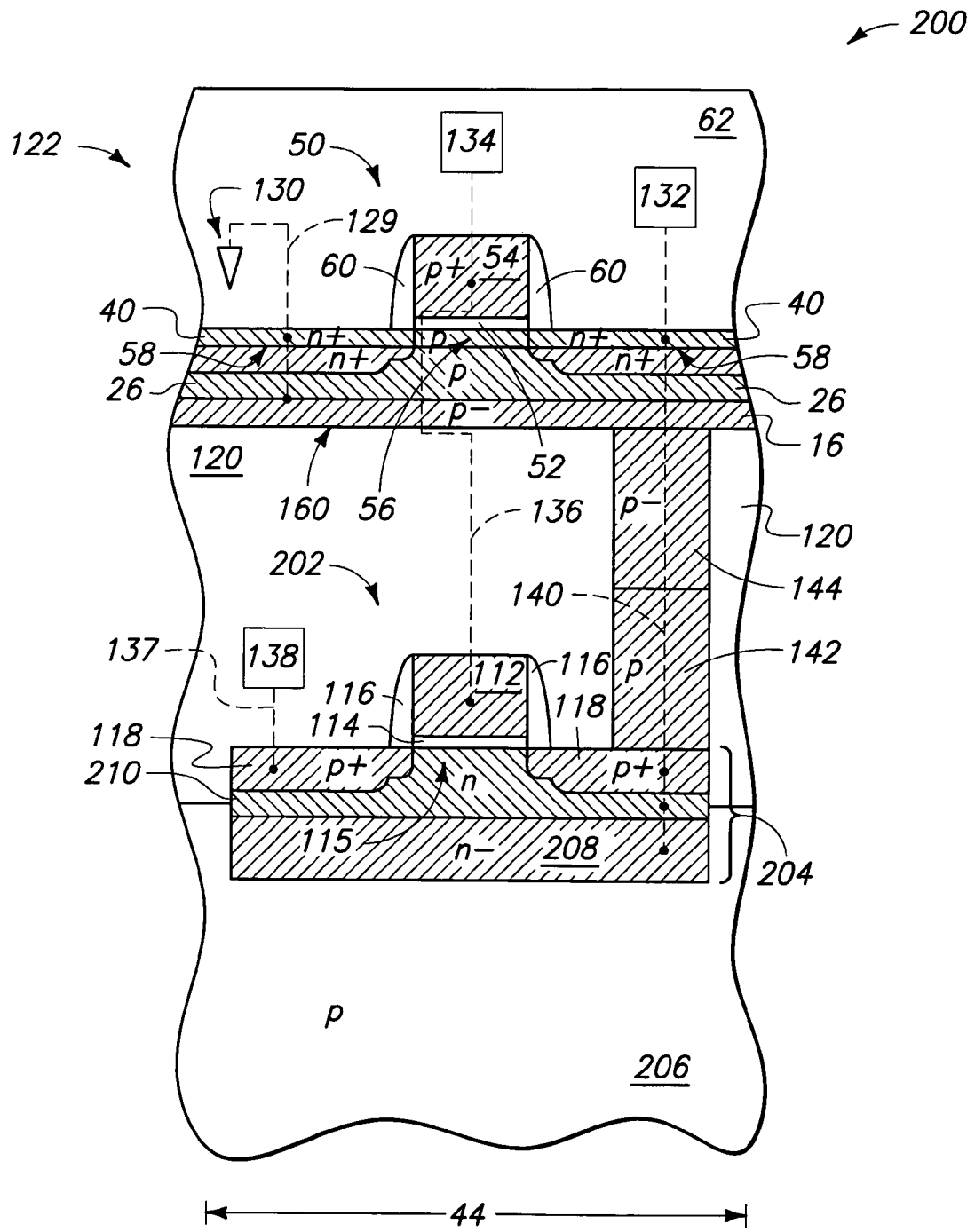
FIG. 12 is a diagrammatic, cross-sectional view of a semiconductor fragment illustrating an exemplary CMOS inverter construction in accordance with an aspect of the present invention.
Figure 13:
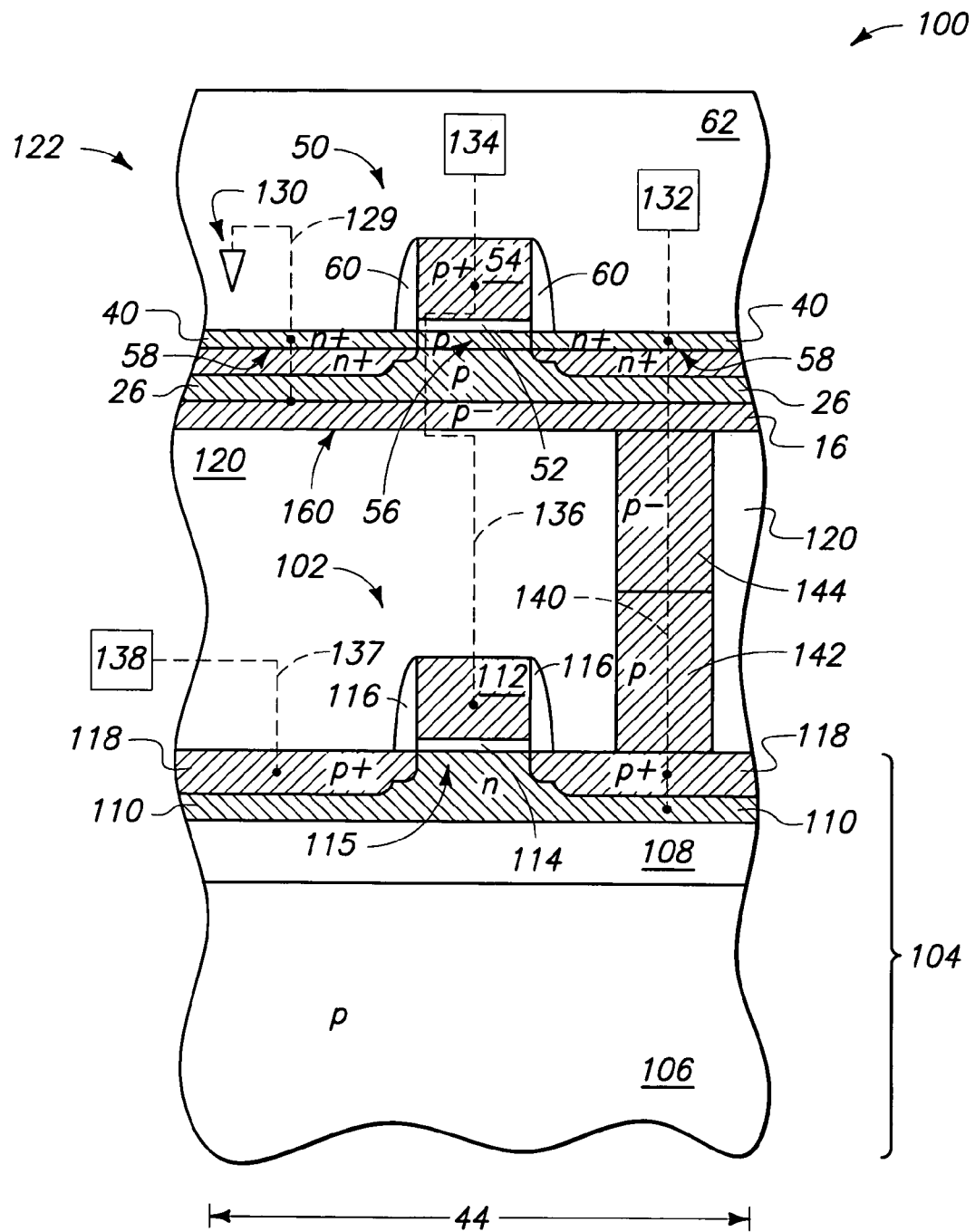
FIG. 13 is a diagrammatic, cross-sectional view of a semiconductor fragment illustrating another exemplary CMOS inverter construction.
Figure 14:
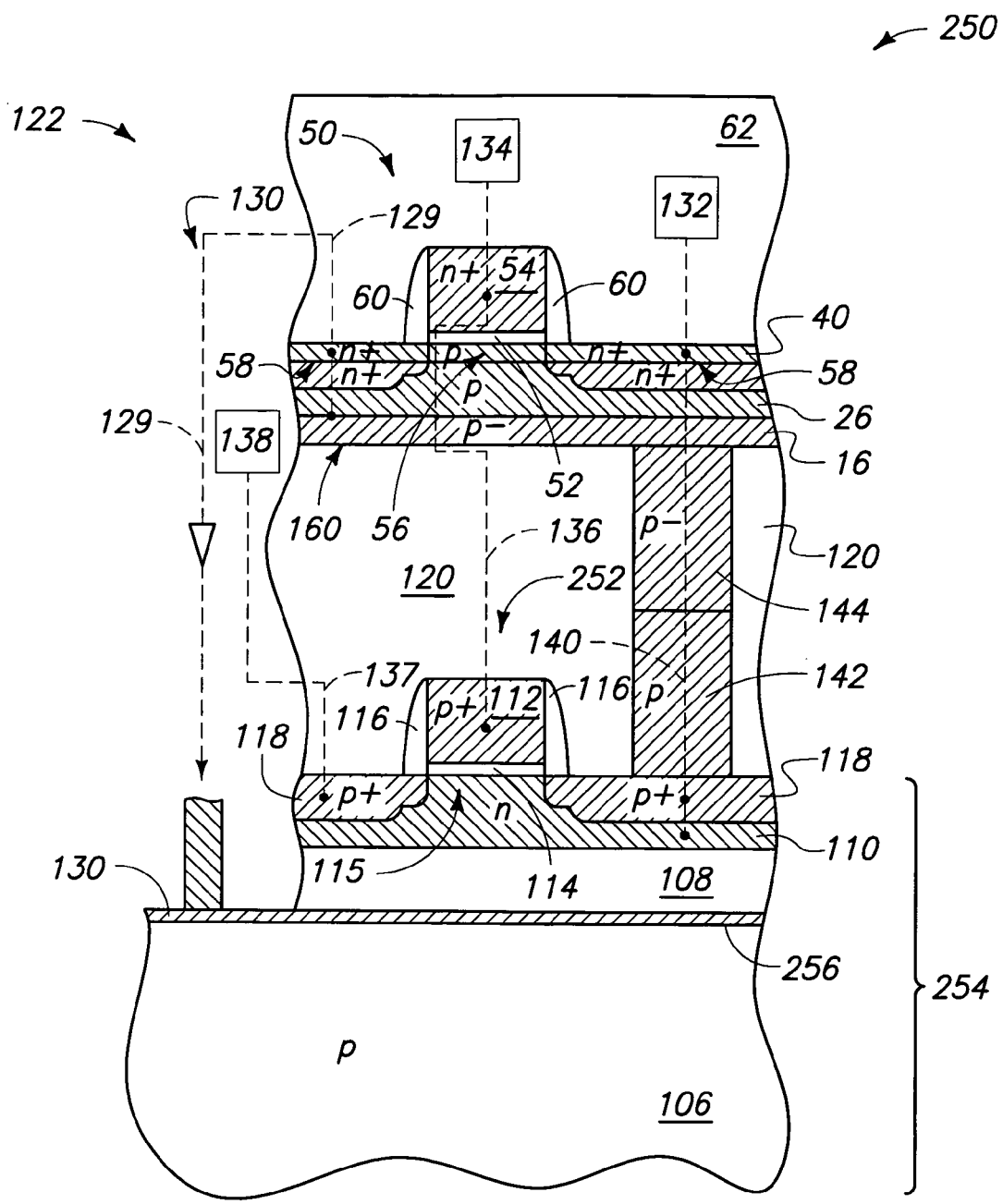
FIG. 14 is a diagrammatic, cross-sectional view of a semiconductor fragment illustrating another exemplary CMOS inverter construction in accordance with an aspect of the present invention.

FIGS. 12-14 illustrate three exemplary inverter constructions in which an n-channel device is formed over a p-channel device. Many components of the inverters of FIGS. 12-14 are identical to one another, and identical numbering will be utilized in describing the embodiments of FIGS. 12-14, where appropriate.

FIG. 12 illustrates an inverter structure 200, FIG. 13 illustrates an inverter construction 100, and FIG. 14 illustrates an inverter construction 250. Each of the inverters comprises an NFET device 50 stacked over a PFET device (202 in FIG. 12, 102 in FIG. 13 and 252 in FIG. 14), although it is to be understood that the elevational order of the PFET and NFET devices can be reversed in other aspects of the invention (not shown).

Constructions 100 (FIG. 12), 200 (FIG. 13) and 250 (FIG. 14) all comprise PFET devices containing transistor gates 112, insulative pads 114, sidewall spacers 116 and source/drain regions 118. Gates 112 can comprise any suitable construction, and in particular aspects will comprise one or more of conductively-doped silicon, metal, and metal compounds (such as, for example, metal silicides). Dielectric materials 114 can comprise, for example, silicon dioxide. Sidewall spacers 116 can comprise, for example, one or both of silicon dioxide and silicon nitride.

Constructions 100 (FIG. 12), 200 (FIG. 13) and 250 (FIG. 14) comprise an insulative material 120 over the PFET devices (102, 202 or 252), and over the substrate underlying the PFET devices. Material 120 can comprise any suitable material, including, for example, borophosphosilicate glass (BPSG) and/or silicon dioxide.

A construction 122 comprising the NFET device 50 (of the type described above with reference to FIG. 9) is formed over insulative material 120. More specifically, construction 122 includes layers 16, 26 and 40, together with transistor gate 54. Layer 16 is preferably electrically conductive, and in the shown application is p-type doped. Layer 16 can consist essentially of, or consist of, a silicon seed material together with an appropriate dopant. It is noted that in the discussion of FIGS. 3-8 it was indicated that material 16 could be oxidized during formation of crystalline materials thereover. In embodiments of the type shown in FIGS. 12-14 it can be preferred that material 16 not be appreciably oxidized during the processing of FIGS. 3-8, but instead remain almost entirely as a non-oxidized form of silicon.

In particular aspects of the invention, layer 16 can be formed by epitaxial growth from a crystalline semiconductive material 144 (discussed below). Accordingly, several steps of the process described in FIGS. 3-8 for forming seed layer 16 can be replaced with an epitaxial growth of the seed layer. The seed layer 16 can be doped with an appropriate dopant utilizing, for example, an implant of the dopant.

Layers 26 and 40 can correspond to a relaxed crystalline lattice material and a strained crystalline lattice material, respectively, as discussed previously with reference to FIGS. 3-9. The material 26 can comprise, consist essentially of, or consist of appropriately doped silicon/germanium; and the layer 40 can comprise, consist essentially of, or consist of appropriately doped silicon, or can comprise, consist essentially of, or consist of appropriately doped silicon/germanium.

Layers 16, 26 and 40 can be considered to be crystalline layers, and in particular aspects all of layers 16, 26 and 40 are crystalline, and can be considered to together define a crystalline structure.

N-type doped source/drain regions 58 extend into layers 26 and 40. In the shown constructions, source/drain regions 58 of NFET device 50 are directly over and aligned with source/drain regions 118 of the PFET devices (102, 202 and 252), and gate 54 of NFET device 50 is directly over and aligned with the gates 112 of the PFET devices.

Although constructions 200 (FIG. 12), 100 (FIG. 13) and 250 (FIG. 14) contain PFET devices having similarities to one another, the constructions also comprise differences amongst the PFET devices.

The PFET device 202 of construction 200 (FIG. 12) is supported by a block 204 of semiconductive material extending into a p-type doped semiconductor substrate 206. Substrate 206 can comprise, for example, bulk monocrystalline p-doped silicon. Block 204 comprises a lower n-type doped region 208 which can comprise, consist essentially of, or consist of n-type doped silicon such as, for example, an n-type doped region formed as an ion-implanted well region over substrate 206. Block 204 also comprises an upper n-type doped region 210 which is of higher n-type impurity doping level than is region 208, and in the shown construction is illustrated as being an n region. Material 210 can comprise, consist essentially of, or consist of n-type doped silicon/germanium, such as, for example, a single crystal-silicon germanium material epitaxially grown over layer 208. The source/drain regions 118 of device 202 are formed within the material 210 of block 204 in construction 200. Source/drain regions 118 of device 202 therefore can, in particular aspects, be considered to extend into the silicon/germanium material 210 associated with block 204. The material 210 is preferably a single crystal material, but it is to be understood that the material 210 can also be polycrystalline.

The PFET device 102 of construction 100 (FIG. 13) is shown supported by a substrate 104 comprising three discrete materials. A first material of the substrate is a p-type doped semiconductive material mass 106, such as, for example, p-type doped monocrystalline silicon. The monocrystalline silicon can be, for example, in the form of a bulk silicon wafer. The second portion of substrate 104 is an insulative material 108 formed over mass 106. Material 108 can comprise, for example, silicon dioxide. The third portion of substrate 104 is a layer 110 of semiconductive material. Such material can comprise, for example, silicon, or a combination of silicon and germanium. Material 110 can correspond to a thin film of semiconductive material, and accordingly layers 110 and 108 can be considered to correspond to a semiconductor-on-insulator construction. Semiconductive material 110 is doped with n-type dopant. Source/drain regions 118 extend into semiconductive material 110. Accordingly, in the shown embodiment source/drain regions 118 can be considered to extend into a thin film of an SOI construction. A channel region 115 is within n-type doped semiconductive material 110, and between source/drain regions 118.

The PFET device 252 of construction 250 (FIG. 14) is supported by a substrate 254 similar to the substrate 104 of FIG. 13. Substrate 254 differs from the substrate 104 in that a conductive film 256 is comprised by substrate 254 and not shown as part of substrate 104 (FIG. 13). Film 256 can comprise any suitable electrically conductive material, including, for example, metal and/or metal compound. Film 256 can be a ground connection, and accordingly layers comparable to 256 would typically be present in other constructions of this disclosure, even though the layers are not specifically illustrated.

The inverter constructions 200, 100 and 250 of FIGS. 12-14 can function as basic CMOS devices. Specifically, transistor devices 202, 102 and 252 correspond to PFET devices and transistor devices 50 correspond to NFET devices. One of source/drain regions 58 of the NFET devices are electrically connected with ground 130 (through interconnects 129 shown in dashed line) and the other are electrically connected with outputs 132 (through interconnects 140 shown in dashed line). The ground interconnects 129 also connect to the NFET body nodes 16/26 as shown. Gates 54 of the NFET devices are electrically connected with inputs 134, and are also electrically tied to gates 112 of the PFET devices through interconnects 136 (shown in dashed line). One of source/drain regions 118 of devices 202, 102 and 252 is connected with $V_{DD}$ 138 (through an interconnect 137 shown in dashed line), and the other source/drain region 118 as well as the n-type bodies of the PFETs are electrically connected with source/drain regions 58 of devices 50 through interconnects 140.

Interconnects 136 are illustrated extending around layers 16, 26 and 40 of constructions 122. Interconnects 136 do not physically connect layers 16, 26 and 40. Interconnects 136 connect the extensions of gates 112 and 54 in the non-active regions into or out of the page (the non-active regions are not shown in the cross-sectional views of FIG. 12-14). Such can be accomplished by conventional interconnect/via technology.

Interconnects 140 are shown schematically to connect the electrical nodes of the n-type body of the bottom PFETs, one of the source/drain p+ nodes 118 of the bottom PFETs, and one of the n+ nodes 40/58 of the source/drains of the top NFETs. It is to be understood that the two p-type doped regions 142/144 resistively connect one of the source/drain nodes of the bottom PFETs to the p-type body 16/26/56 of the top NFETs.

Regions 142 and 144 can be considered to be separate portions of p-type doped vertical layers (i.e., vertically extending layers), or can be considered to be separate vertical layers. Portion 142 is shown to be more heavily doped than is portion 144.

In the shown aspects of the invention, layer 16 comprises a p-type doped semiconductive material, such as, for example, p-type doped silicon. Also, it is noted that layer 16 is preferably either entirely one single crystal, or if layer 16 is polycrystalline, individual crystals are preferably as large as the preferred individual crystals of layers 26 and 40. One or both of the p-type doped semiconductor materials 16 and 26 can be more heavily doped than one or both of the vertical layers 142 and 144 between layer 16 and source/drain region 118 of the constructions of FIGS. 12-14; or one or both of the materials 16 and 26 can be comparably doped to one or both of layers 142 and 144 of the vertically extending pillars.

Another exemplary CMOS inverter construction 300 is shown in FIG. 15. Construction 300 includes a PFET device 302 stacked over an NFET device 304. The PFET and NFET device share a transistor gate 306.

NFET device 304 is formed over a bulk substrate 308. Substrate 308 can comprise, for example, a monocrystalline silicon wafer lightly-doped with a background p-type dopant.

A block 310 of p-type doped semiconductive material extends into substrate 308. Block 310 can comprise, for example, silicon/germanium, with the germanium being present to a concentration of from about 10 atomic % to about 60 atomic %. The silicon/germanium of material 310 can have a relaxed crystalline lattice in particular aspects of the invention. Material 310 can be referred to as a first layer in the description which follows.

A second layer 312 is over first layer 310. Second layer 312 comprises an appropriately-doped semiconductive material, and in particular applications will comprise a strained crystalline lattice. Layer 312 can, for example, comprise doped silicon/germanium having a strained crystalline lattice, with the germanium concentration being from about 10 atomic % to about 60 atomic %.

Gate 306 is over layer 312, and separated from layer 312 by a dielectric material 311. The dielectric material can comprise, for example, silicon dioxide.

Gate 306 can comprise any appropriate conductive material, including, for example, conductively-doped semiconductor materials (such as conductively-doped silicon), metals, and metal-containing compositions. In particular aspects, gate 306 will comprise a stack of materials, such as, for example, a stack comprising conductively-doped silicon and appropriate metal-containing compositions.

Source/drain regions 314 extend into layers 312 and 310. The source/drain regions are heavily doped with n-type dopant. In particular aspects, sidewall spacers (not shown) can be formed along sidewalls of gate 306.

The shown source/drain regions 314 have a bottom periphery indicating that the regions include shallow portions 316 and deeper portions 318. The shallow portions 316 can correspond to, for example, lightly doped diffusion regions.

NFET device 304 comprises a p-type doped region beneath gate 306 and between source/drain regions 314. Such p-type doped region corresponds to a channel region 320 extending between source/drain regions 314.

An active region of NFET device 304 can be considered to include source/drain regions 314 and the channel region between the source/drain regions. Such active region can, as shown, include a portion which extends across layer 312, and another portion extending into layer 310. Preferably, the majority of the active region within portion 310 is contained in a single crystal, and more preferably the entirety of the active region within portion 310 is contained in a single crystal. Accordingly, the shown layer 310 is preferably monocrystalline or polycrystalline with very large individual crystals. It can be further preferred that the majority or even entirety of the active region within layer 312 also be contained within a single crystal, and accordingly it can be preferred that layer 312 also be monocrystalline or polycrystalline with very large individual crystals. Further, layer 312 can be formed by epitaxial growth over layer 310, and accordingly layers 312 and 310 can both be considered to be part of the same crystalline structure. The entirety of the shown active region can thus be contained within only one single crystal that comprises both of layers 310 and 312.

A dielectric material 322 is formed over gate 306. Dielectric material 322 can comprise, for example, silicon dioxide.

A layer 324 is formed over dielectric material 322. Layer 324 can be referred to as a third layer to distinguish layer 324 from first layer 310 and second layer 312. Layer 324 can comprise, for example, a crystalline semiconductive material, such as, for example, crystalline Si/Ge. In particular aspects, layer 324 will be monocrystalline, and will comprise appropriately-doped silicon/germanium. The germanium content can be, for example, from about 10 atomic % to about 60 atomic %. In other aspects, layer 324 can be polycrystalline; and in some aspects layer 324 can be polycrystalline and have individual grains large enough so that an entirety of a portion of an active region of PFET device 302 within layer 324 is within a single grain.

A fourth layer 326 is formed over layer 324. Layer 326 can comprise, consist essentially of, or consist of appropriately-doped semiconductive material, such as, for example, appropriately-doped silicon. In the shown embodiment, layers 324 and 326 are n-type doped (with layer 326 being more lightly doped than layer 324), and layer 324 is incorporated into the PFET device 302.

Heavily-doped p-type source/drain regions 328 extend into layer 304. Source/drain regions 328 can be formed by, for example, an appropriate implant into layer 324. Layer 324 is n-type doped between source/drain regions 328, and comprises a channel region 330 that extends between source/drain regions 328.

A conductive pillar 332 extends from source/drain region 314 to layer 324, and accordingly electrically connects a source/drain region 314 with substrate 324. Electrically conductive material 332 can comprise, for example, n-type doped semiconductive material, as shown.

An insulative material 334 is provided over substrate 308, and surrounds the inverter comprising NFET device 304 and PFET device 302. Insulative material 334 can comprise, consist essentially of, or consist of any appropriate insulative material, such as, for example, borophosphosilicate glass (BPSG), and/or silicon dioxide.

The inverter construction 300 of FIG. 15 can function as a basic CMOS logic building block. One of the source/drain regions 314 of the NFET device and the body 310 are electrically connected with ground 340 through interconnect 339 (shown in dashed line) and the other source/drain region of the NFET is electrically connected with an output 342 through interconnect 341 (shown in dashed line). Gate 306 is electrically connected with an input 344 through interconnect 343 (shown in dashed line). One of the source/drain regions 328 of PFET device 302 is connected with $V_{DD}$ 346 through interconnect 345 (shown in dashed line), while the other is electrically connected to output 342 through interconnect 341. The n-body of the PFET is also connected to the output interconnect 341.

FIG. 16 illustrates an alternative embodiment inverter relative to that described above with reference to FIG. 15. Specifically, FIG. 16 illustrates an inverter construction 400 comprising a PFET device 402 stacked over an NFET device 404. The PFET and NFET devices share a common gate 406.

Construction 400 comprises a substrate 408 and an insulator layer 410 over the substrate. Substrate 408 and insulator 410 can comprise, for example, the various materials described above with reference to substrate 12 and insulator 14 of FIG. 3.

A first layer 412, second layer 414 and third layer 416 are formed over insulator 410. Layers 412, 414 and 416 can correspond to, for example, identical constructions as layers 16, 26 and 40, respectively, of FIG. 9.

Layers 412, 414 and 416 can be initially doped with a p-type dopant. Subsequently, n-type dopant can be implanted into the layers to form heavily-doped source/drain regions 418.

A channel region 420 extends between source/drain regions 418, and under gate 406. An active region of the NFET device comprises source/drain regions 418 and channel region 420. Such active region includes a portion within layer 416, and another portion within layer 414. Preferably, the portion of the active region within layer 414 is predominately or even entirely contained within a single crystal of layer 414. A portion of the active region within layer 416 is preferably predominately or entirely within a single crystal of layer 416.

A dielectric material 422 is formed over layer 416, and is provided between layer 416 and gate 406. Dielectric material 422 can comprise, for example, silicon dioxide.

Sidewall spacers (not shown) can be provided along sidewalls of gate 406.

A second dielectric material 424 is provided over gate 406. Dielectric material 424 can comprise, for example, silicon dioxide.

A layer 426 of semiconductive material is provided over dielectric material 424, and a layer 428 of semiconductive material is provided over layer 426. Layer 426 can comprise, for example, appropriately-doped silicon/germanium, and layer 428 can comprise, for example, appropriately-doped silicon. Accordingly, layers 426 and 428 comprise constructions identical to those described with reference to layers 324 and 326 of FIG. 15.

A semiconductive material pillar 430 extends from layer 416 to layer 426.

P-type doped source/drain regions 432 extend into layer 426.

A channel region 434 extends between source/drain regions 432, and above gate 406.

An active region of the PFET device 402 includes source/drain regions 432 and channel region 434. In particular embodiments, such active region is predominately or even entirely contained within a single crystal of silicon/germanium layer 426.

The inverter of construction 400 can function as a basic CMOS logic building block. One of the source/drain regions 418 of the NFET device is electrically connected with ground 440 through interconnect 439 (shown in dashed line) while the other is electrically connected with an output 442 through interconnect 441 (shown in dashed line). Substrate 414 can also be connected to the ground interconnect 439, as shown. Gate 406 is electrically connected with an input 444 through interconnect 443 (shown in dashed line). One of the PFET source/drain regions 432 is electrically connected with the output interconnect 441, and the other is connected with $V_{DD}$ 446 through interconnect 445 (shown in dashed line). The n-doped body of the PFET is also connected to the output interconnect 441.

Figure 17:
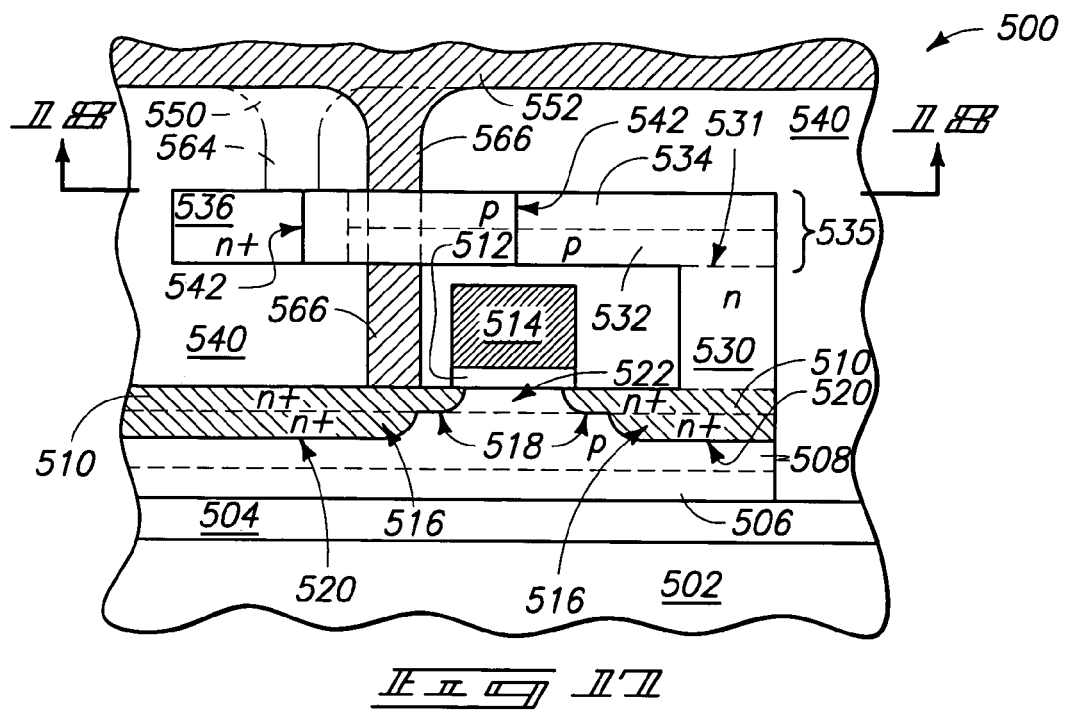
FIG. 17 is a diagrammatic, cross-sectional view of a semiconductor fragment illustrating an exemplary semiconductor construction comprising a transistor and resistor.
Figure 18:
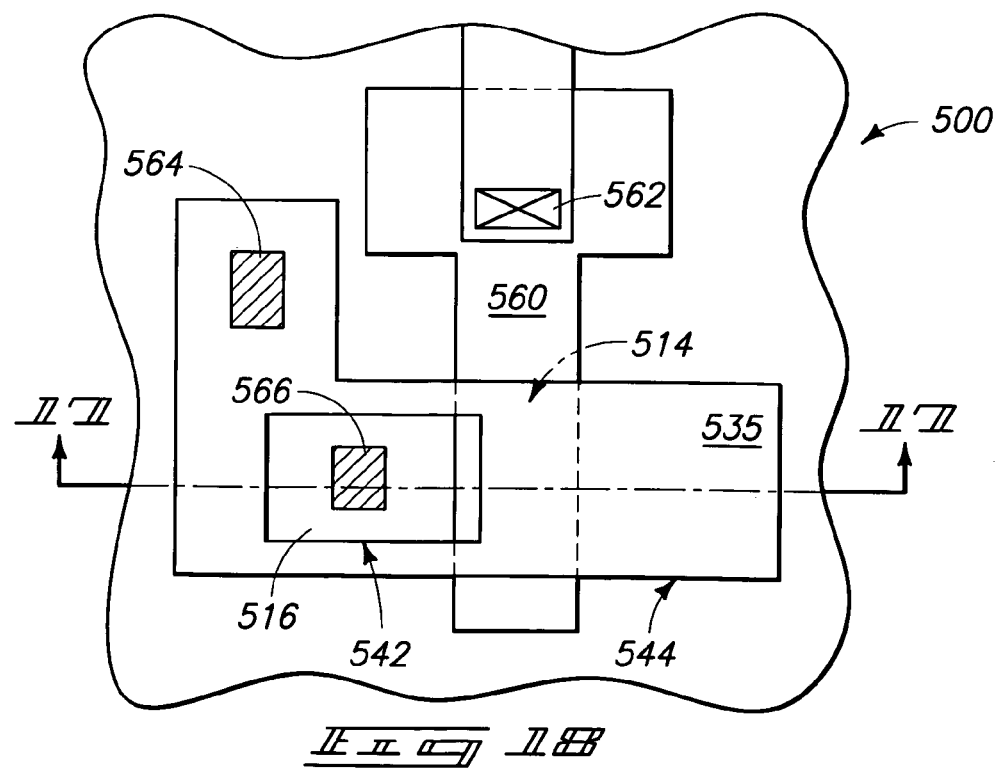
FIG. 18 is a top cross-sectional view along the line 18-18 of the construction comprising the FIG. 17 fragment. The FIG. 17 cross-section is along the line 17-17 of FIG. 18.

FIGS. 17 and 18 show a semiconductor construction 500 comprising a transistor/resistor assembly that can be incorporated into various aspects of the invention. Construction 500 includes a substrate 502 having an insulative layer 504 formed thereover. Substrate 502 and insulative layer 504 can comprise, for example, the materials described previously with reference to substrate 12 and insulator layer 14, respectively.

A first crystalline layer 506, second crystalline layer 508, and third crystalline layer 510 are formed over insulative material 504. Layers 506, 508 and 510 can correspond to a silicon seed layer, relaxed crystalline lattice layer, and strained crystalline lattice layer, respectively. In particular aspects, layers 506, 508 and 510 can comprise materials described previously for layers 16, 26 and 40, respectively.

A dielectric material 512 is over layer 510, and a transistor gate 514 is over dielectric material 512. Dielectric material 512 can comprise, consist essentially of, or consist of silicon dioxide. Transistor gate 514 can comprise, for example, one or more of metal and conductively-doped silicon; and can, for example, comprise materials described previously with reference to transistor gate 54.

A pair of source/drain regions 516 extend through strained crystalline lattice layer 510 and into relaxed crystalline lattice layer 508. The source/drain regions comprise a shallow portion 518, and a deeper portion 520.

A channel region 522 extends beneath gate 514, and between source/drain regions 516. An NFET transistor device comprises gate 514, source/drain regions 516 and channel region 522. Although the shown transistor device is an NFET device, it is to be understood that the invention encompasses other aspects (not shown) in which the transistor device is a PFET device.

Source/drain regions 516 and channel region 522 define an active region of the transistor device. For reasons described previously, it can be advantageous to have a majority, and preferably the entirety, of the portion of the active region within layer 508 contained within a single crystal of the crystalline material of layer 508; and it can also be advantageous to have the majority or entirety of the portion of the active region within layer 510 contained within a single crystal of the material 510.

The crystalline materials of layers 506, 508 and 510 can be monocrystalline in order that an entirety of the active region within such crystalline materials is within single crystals of the materials. Alternatively, the materials can be polycrystalline, with individual single crystals being large enough to accommodate an entirety of the portion of the active region extending within the various materials. In particular aspects, layers 508 and 510 will be extensions of a crystalline lattice defined by material 506. In such aspects, an entirety of the active region of the transistor device will preferably extend within only a single crystal encompassing materials 506, 508 and 510.

A conductive pillar 530 is formed in electrical connection with one of the source/drain regions 516. In the shown embodiment, pillar 530 comprises n-type doped silicon, and is formed in physical contact with an upper surface of layer 510.

A pair of crystalline materials 532 and 534 are formed over pillar 530. In the shown aspect of the invention, pillar 530 comprises an upper surface 531, and layer 532 is formed physically against such upper surface.

An electrical node 536 is formed at a location distant from conductive pillar 530, and crystalline materials 532 and 534 extend between node 136 and pillar 530. Crystalline materials 532 and 534 together define a resistor 535 extending between a first electrical node defined by pillar 530, and a second electrical node defined by the shown node 536.

Crystalline materials 532 and 534 may or may not comprise different compositions from one another. Crystalline material 532 can comprise, consist essentially of, or consist of p-type doped silicon; and crystalline material 534 can comprise, consist essentially of, or consist of p-type doped silicon/germanium. Alternatively, the two layers can be replaced with a single layer of either p-doped silicon or p-doped silicon/germanium.

An insulative material (or mass) 540 is over gate 514, and resistor 535 is separated from gate 514 by the insulative material.

Construction 500 includes a contact 566 extending from a source/drain region 516, through an opening in resistor 535 (the opening has a periphery 542), and to an interconnect 552 which electrically connects with ground (not shown). Construction 500 also includes a contact 564 (shown in phantom view in FIG. 17 as it is behind the cross-section of FIG. 17). Contact 564 extends to node 536. An interconnect 550 (shown in phantom view in the cross-section of FIG. 17) extends between contact 564 and $V_{DD}$ (not shown in FIG. 17). In particular aspects, node 536 can be considered to be part of the electrical connection to $V_{DD}$.

FIG. 18 illustrates a top view of construction 500, with insulative mass 540 not being shown in FIG. 18 to aid in clarity of the illustration. Gate 514 is part of a conductive line 560, which is connected through an electrical stud 562 to other circuitry.

Resistor 535 is shown comprising a "L" shape having an opening extending therethrough for passage of contact 566. Resistor 535 is shown to comprise an outer surface 544, and an inner surface 542. The inner surface 542 defines the periphery of the opening around the contact 566. The shown geometry of the resistor is but one exemplary form of the resistor and it is to be understood that the resistor can have other geometries.

Particular aspects of the present invention pertain to formation of SRAM constructions. The SRAM constructions can be, for example, six transistor constructions having the basic schematic layout of the type described with reference to FIG. 1, or can be four transistor constructions having the basic schematic layout of the type described with reference to FIG. 2. If the SRAM constructions are four transistor constructions, the resistors utilized in the constructions (i.e., the resistors 784 and 786 of FIG. 2) can be conventional resistors, or can be resistors of the type described with reference to FIG. 17 as a resistor 535.

Figure 19:
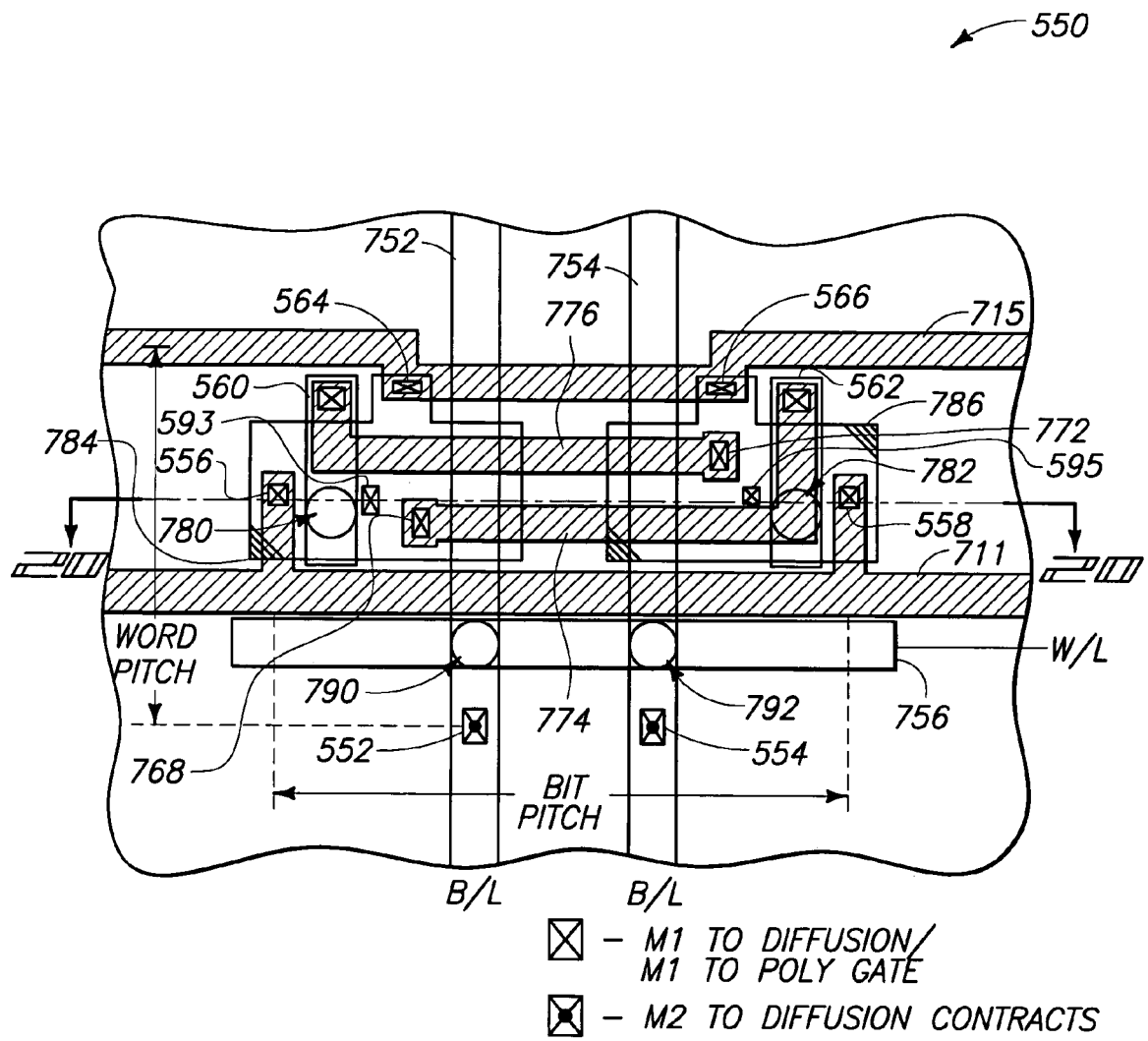
FIG. 19 is a diagrammatic, fragmentary, top view of an exemplary four-transistor SRAM construction that can be formed in accordance with an aspect of the present invention.
Figure 20:
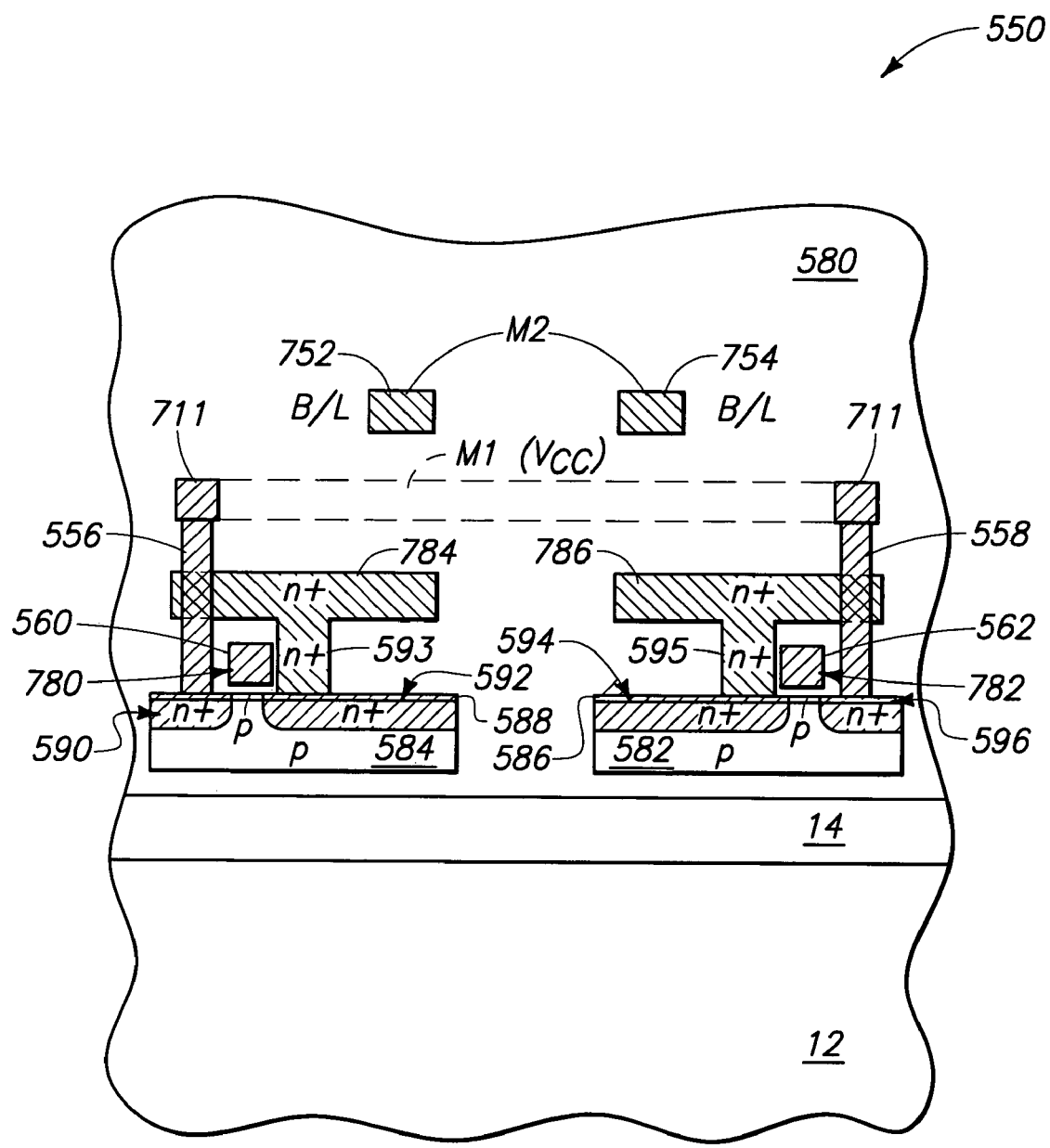
FIG. 20 is a diagrammatic, cross-sectional view along the line 20-20 of FIG. 19.

An exemplary four transistor SRAM construction 250 with load resistors is illustrated in FIGS. 19 and 20.

Figure 2:
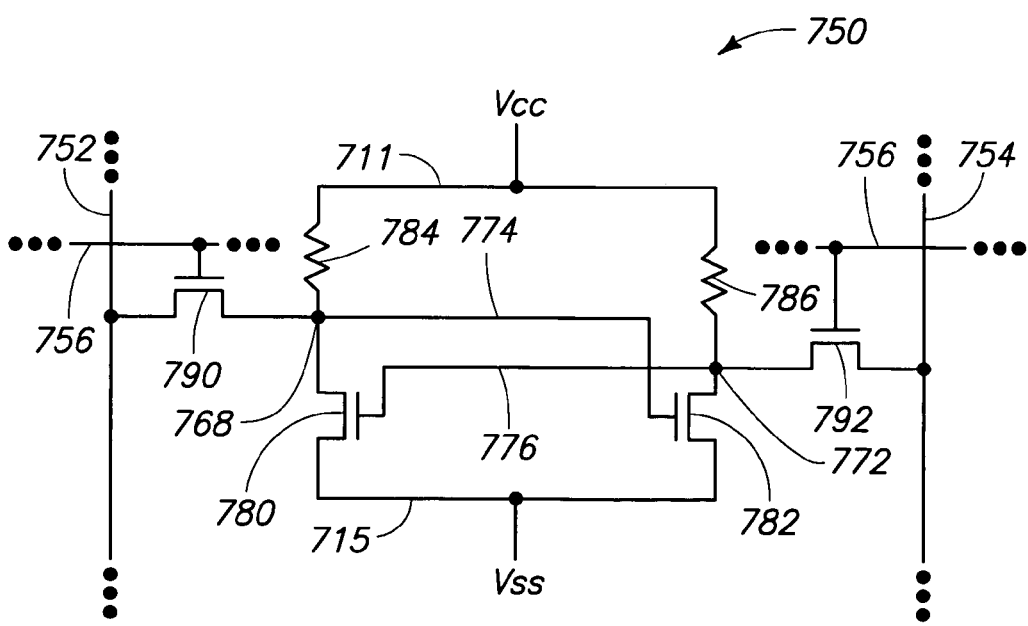
FIG. 2 illustrates a circuit schematic of a prior art SRAM cell different from the cell of FIG. 1.

Referring to FIGS. 19 and 20, similar numbering will be utilized as was used above in describing prior art FIG. 2, where appropriate. FIG. 19 shows bitlines 752 and 754 extending vertically through an exemplary SRAM construction 550, and shows $V_{SS}$ line 715 and $V_{CC}$ line 711 extending substantially horizontally through the SRAM construction. Additionally, wordline 756 is shown extending substantially horizontally through the construction.

Access devices 790 and 792 are diagrammatically illustrated along wordline 756. Access device 790 has a diffusion region which extends to a common node 768, and also has a diffusion region extending to an interconnect 552 which connects to bitline 752. Similarly, device 792 has a diffusion region on one side which extends to common node 772, and a diffusion region on the other side which connects to an interconnect 554 extending to bitline 754.

The SRAM construction 550 comprises a pair of load resistors 784 and 786 which connect to $V_{CC}$ at interconnects 556 and 558, respectively.

Construction 550 also comprises gate lines 560 and 562 extending substantially vertically and beneath resistors 784 and 786, respectively. The gate lines comprise devices 780 and 782, and such devices are shown diagrammatically by circles along the lines 560 and 562. Device 780 has a diffusion region extending to common node 768, and also has a diffusion region extending to an interconnect 564 which connects with $V_{SS}$ 715. Similarly, device 782 comprises a source/drain region extending to common node 772, and also comprises a source/drain region extending to an interconnect 566 which connects with $V_{SS}$ (or ground) 715.

Gate line 560 is shown connected to common diffusion region 772 through an interconnect 776, and gate line 562 is shown connected to common diffusion region 768 through an interconnect 774.

The various lines of the 550 construction are at least three different elevational levels. Specifically, wordline 756, and gate lines 560 and 562 typically consist essentially of conductively-doped polysilicon and are at a first elevational level over a substrate. $V_{CC}$ line 711, ground line 715, and interconnects 774 and 776 are typically metal-containing materials formed at a second elevational level above the first elevational level, and can correspond to so-called metal one (M1) materials. Bitlines 752 and 754 are formed at a third elevational level above the second elevational level, typically comprise metal, and can correspond to so-called metal two (M2) lines. Cross-hatching is utilized to indicate the lines of the M1 level.

An electrically insulative material would be formed over and around the various lines of the FIG. 19 construction. Such insulative material is not shown in FIG. 19 to simplify the drawing. FIG. 20 shows a cross-sectional view of the FIG. 19 construction, and illustrates the elevational relationships of various components of the FIG. 19 construction. FIG. 20 also shows the electrically insulative material (labeled as 580) extending around the various components of the FIG. 19 construction.

FIG. 20 shows construction 550 formed in association with a substrate 12 and insulative material 14, which can comprise the same construction as described above with reference to FIG. 3. Additionally, insulative material 580 is shown formed over substrate 14, and semiconductive materials 582 and 584 are formed on the insulative isolation material. Insulative isolation material 580 can comprise, for example, silicon dioxide, borophosphosilicate glass, or any other suitable electrically insulative material. Additionally, although material 580 is shown comprising a single homogenous material, it is to be understood that material 580 can comprise various layers of insulative materials in other aspects of the invention (not shown).

Semiconductive materials 582 and 584 are shown to be background p-type doped. Materials 582 and 584 can comprise, for example, silicon/germanium having a relaxed crystalline lattice. Materials 586 and 588 are shown formed over materials 582 and 584, respectively. Materials 586 and 588 can comprise, for example, silicon or silicon/germanium having a strained crystalline lattice. Accordingly, materials 582 and 584 can be analogous to the layer 26 described previously with reference to FIGS. 1-9, and layers 586 and 588 can be analogous to the layers 40 described previously with reference to FIGS. 1-9. It is to be understood, however, that the shown materials are exemplary materials, and that other semiconductive materials can be utilized in place of materials 582, 584, 586 and 588.

Source/drain diffusion regions 590 and 592 extend into materials 584 and 588; and source/drain diffusion regions 594 and 596 extend into materials 582 and 586. The source/drain diffusion regions 590, 592, 594 and 596 are illustrated to be n-type conductively doped. Gate lines 560 and 562 are shown extending over materials 588 and 586, respectively, and separated from such materials by insulative dielectric material. Gate line 560 comprises device 780, which gatedly connects diffusion regions 590 and 592. Similarly, gate line 562 comprises device 782, which gatedly connects source-drain regions 594 and 596.

Source/drain regions 592 and 594 are shown in electrical connection with resistors 784 and 786, respectively, through conductive pedestals 593 and 595. Source/drain regions 590 and 596 are shown electrically connected with $V_{CC}$ 711 through interconnects 556 and 558, respectively.

The bit lines 752 and 754 are shown extending over the metal one layer 711 and accordingly are shown corresponding to a metal two layer.

Figure 21:
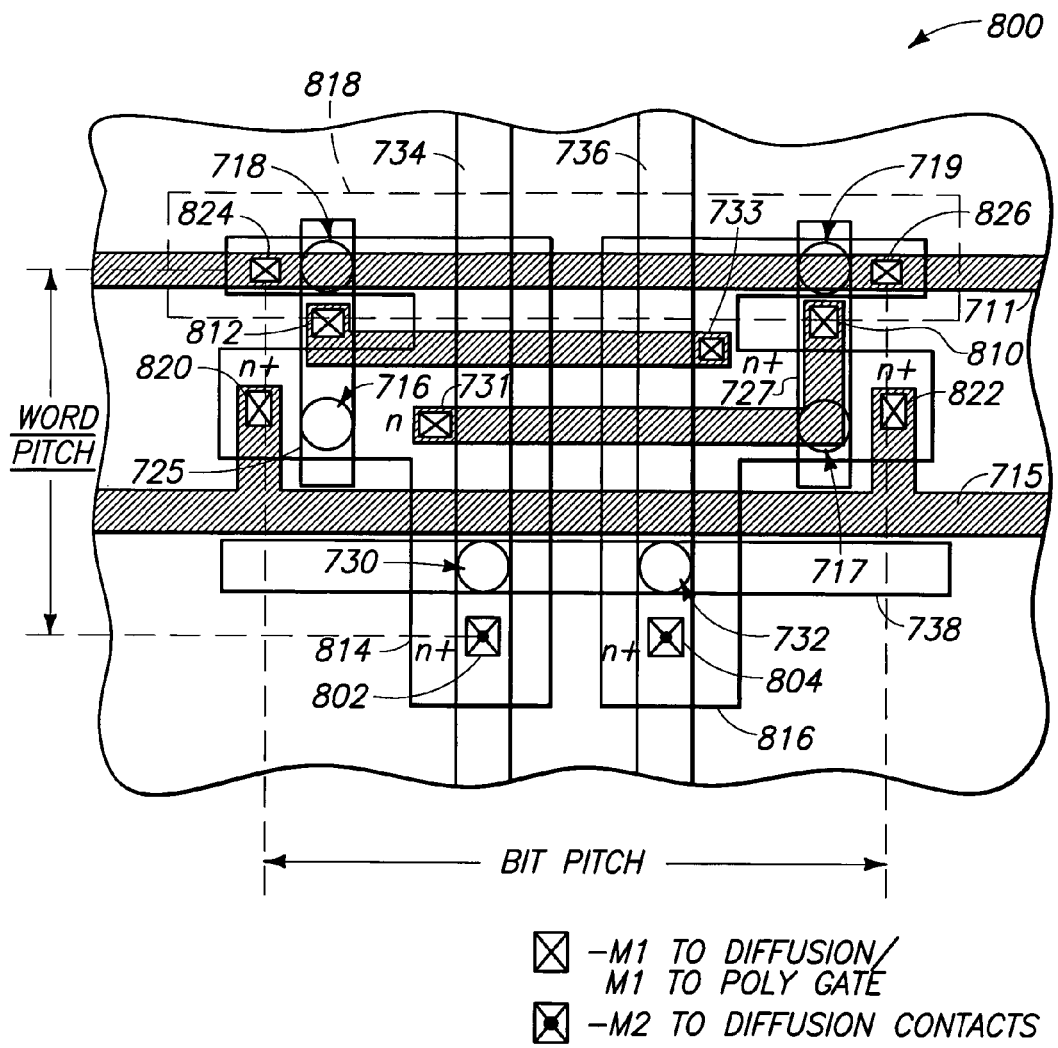
FIG. 21 is a diagrammatic, fragmentary, top view of an exemplary SRAM construction that can be formed in accordance with an aspect of the present invention.

An exemplary six transistor SRAM construction 800 is illustrated in FIG. 21. In describing the construction of FIG. 21, similar numbering will be utilized as was used in describing the prior art construction of FIG. 1. The SRAM construction 800 includes bitlines 734 and 736, and includes wordline 738. The construction also includes the $V_{CC}$ line 711 and the $V_{SS}$ (or ground) line 715.

A gate of the access transistor 730 is diagrammatically illustrated with a circle at one location of wordline 738, and a gate of the access transistor 732 is diagrammatically illustrated with another circle at another location of wordline 738. An interconnect 802 is provided where a source/drain region of access transistor device 730 connects to bitline 734, and another interconnect 804 is provided where a source/drain region of access device 732 connects with bitline 736. Bitlines 734 and 736 extend vertically, while the wordline 738 accessing the SRAM cell extends horizontally in the shown construction of FIG. 21.

Lines 725 and 727 extend vertically in the view of FIG. 21. A gate of NFET device 716 is shown diagrammatically with a circle at one location of line 725, and a gate of PFET device 718 is shown diagrammatically with another circle at another location of line 725. Similarly, a gate of NFET device 717 is shown diagrammatically at one location of line 727, and a gate of PFET device 719 is shown diagrammatically at another location of line 727. Lines 725 and 727 together represent the gates of the four transistor core (two NFET-PFET pairs) of the SRAM cell.

Common node 731 represents the output node for CMOS inverter 718, and common node 733 represents the output node of the CMOS inverter 719. Common node 731 is tied to gate 727 through an interconnect 810, and common node 733 is shown tied to gate 725 through an interconnect 812.

A border 814 defining a shape of a backwards "F" is provided to show an approximate boundary of the active regions of devices 730, 716 and 718. Similarly, a border 816 having a shape of a "F" is provided to show the approximate borders of the active regions of devices 732, 717 and 719. Additionally, a dashed line 818 is provided to show the approximate location of an n-well. Accordingly, the portions of the active regions within the border of dashed line 818 are active regions corresponding to PFET devices, whereas the active regions outside of the region bounded by dashed line 818 correspond to active regions of NFET devices.

An interconnection between ground line 715 and a source/drain region associated with device 716 occurs at location 820, and an interconnect between ground line 715 and a source/drain region of device 717 occurs at location 822. Also, an interconnection between $V_{CC}$ line 711 and a source/drain region associated with PFET device 718 occurs at location 824, and an interconnection between $V_{CC}$ line 711 and a source/drain region associated with PFET 719 occurs at location 826.

Various of the transistor devices of construction 800, (in particular aspects, all of the transistor devices of construction 800) can comprise the structures described with reference to FIGS. 9 and 11 (i.e., can comprise transistor constructions having active regions extending into silicon/germanium; and preferably having a majority, or even an entirety, of the active region within the silicon/germanium being contained within a single crystal of the silicon/germanium, as well as containing other preferred aspects described with reference to FIGS. 9 and 11). Further, the CMOS pairs (i.e., the paired devices 716 and 718, and the paired devices 717 and 719), can comprise constructions of the types described with reference to FIGS. 12-16 above.

The construction of FIG. 21 comprises several layers of conductive lines, with the bitlines typically corresponding to a so-called metal 2 layer; the ground line and $V_{CC}$ line corresponding to a so-called metal 1 layer (and indicated with cross-hatching to show that they are at a different level than the bitlines); the connection between regions 733 and 812, as well as the connection between 731 and 810 corresponding to so-called metal 1 layers; and lines 738, 725 and 727 being heavily doped polysilicon gate lines below the metal 1 layers.

Although some stacking is utilized in forming construction 800, significantly more stacking can be utilized in various aspects of the invention, as described below with reference to FIGS. 22 and 23. The construction of FIG. 21 will accordingly typically comprise significantly more semiconductor real estate than will more highly stacked constructions. The construction of FIG. 21 would typically be a 100F$^2$ cell, or larger (where F corresponds to the minimum feature size achievable with the processing utilized to form the SRAM cell).

Figure 22:
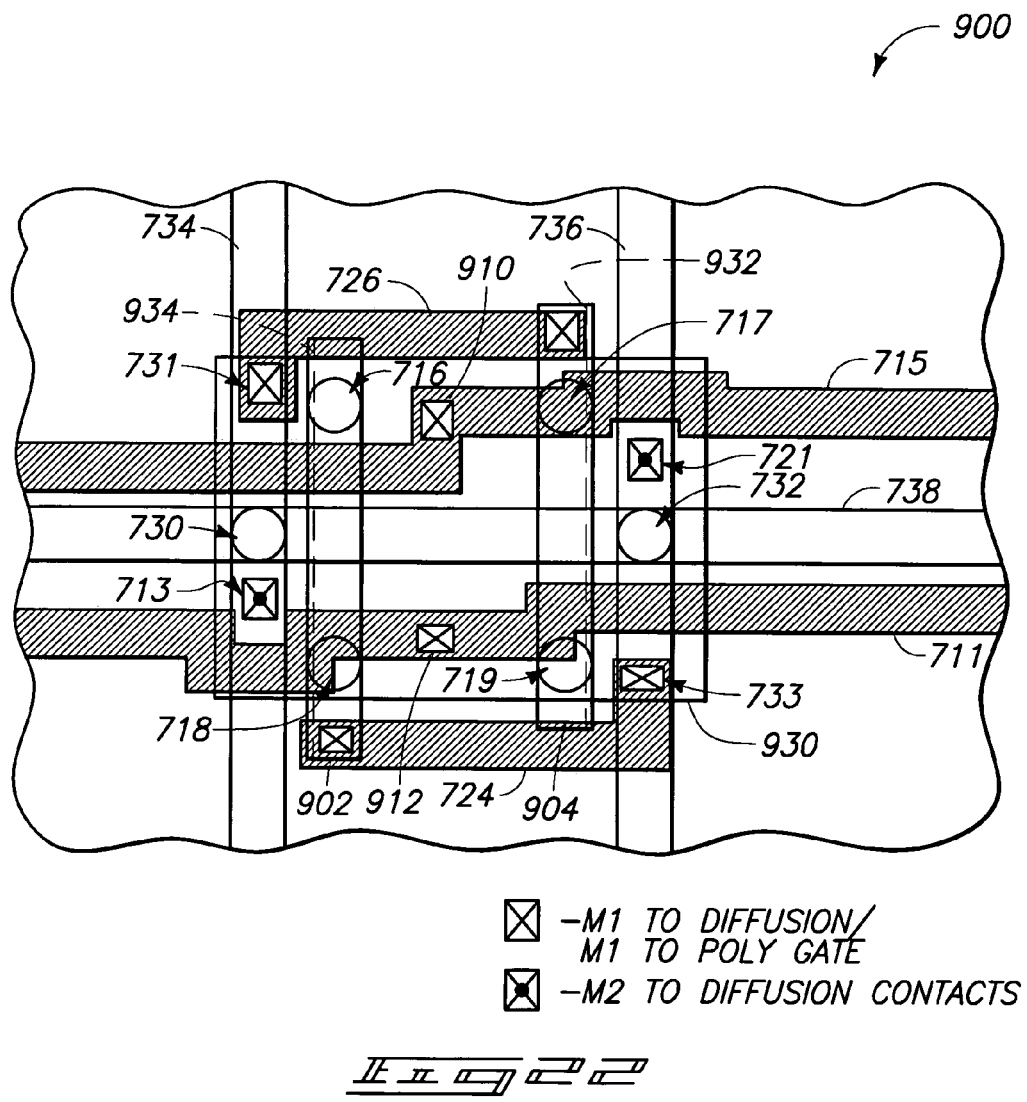
FIG. 22 is a diagrammatic, fragmentary, top view of another exemplary SRAM that can be formed in accordance with an aspect of the present invention.

Referring next to FIG. 22, an SRAM construction more stacked than that of FIG. 21 is illustrated. The stacked configuration of FIG. 22 can be accomplished utilizing, for example, one or more of the stacked CMOS configurations of FIGS. 15 and 16. In referring to FIG. 22, similar numbering will be used as was utilized in describing the prior art of FIG. 1.

FIG. 22 shows a construction 900 comprising bitlines 734 and 736, and also comprising wordline 738. $V_{CC}$ line 711 and $V_{SS}$ line 715 pass through the construction.

The gates of access transistors 730 and 732 are diagrammatically illustrated along wordline 738. Additionally, the node 713 is illustrated where bitline 734 connects with a diffusion region of access transistor 730, and the node 721 is shown where bitline 736 connects with the diffusion region of access transistor 732.

A pair of common gate lines 902 and 904 are shown within construction 900. Gate line 902 comprises the gates of devices 716 and 718, and line 904 comprises the gates of devices 717 and 719.

Common node contact 731 concurrently connects internal diffusion nodes of the inverter devices 716 and 718 with that of the access transistor 730. Similarly, common node contact 733 connects internal diffusion nodes of the inverter devices 717 and 719 with that of the access transistor 732. Gate line 902 is connected to node contact 733 through interconnect 724; and gate line 904 is connected to node 731 through interconnect 726.

A common contact 910 serves to connect the common n+ diffusion region of the two driver NFETs with the ground line 716. Similarly, a common contact 912 serves to connect the common p+ diffusion region of the two load PFETs with the $V_{CC}$ line 711.

A rectangular boundary 930 extends around the active regions of devices 718 and 719 (the bottom PFETs), the NFET driver devices 716 and 717 being stacked, respectively, on 718 and 719 employing common gates 902 and 904. It is noted that the active regions associated with wordline 738 would be elevationally above the active regions of devices associated with common gates 902 and 904. Wordline 738 corresponds to the common gate of access device pairs 730 and 732 and consists of an n+ doped second level of polysilicon line. The dashed lines 932 and 934 correspond to the internal peripheries of active regions associated with access devices 730 and 732. The elevational difference between the three active regions: PFET load devices, NFET driver devices and NFET access devices are described in more detail with reference to FIG. 23 (below).

The stacked configuration of FIG. 22 can allow an SRAM cell to be formed within a significantly smaller footprint than could the device of FIG. 21. For instance, the SRAM of FIG. 22 can be formed in a footprint that is $50F^2$ or less (where F corresponds to the minimum feature size achievable with the processing utilized to form the SRAM cell).

Figure 23:
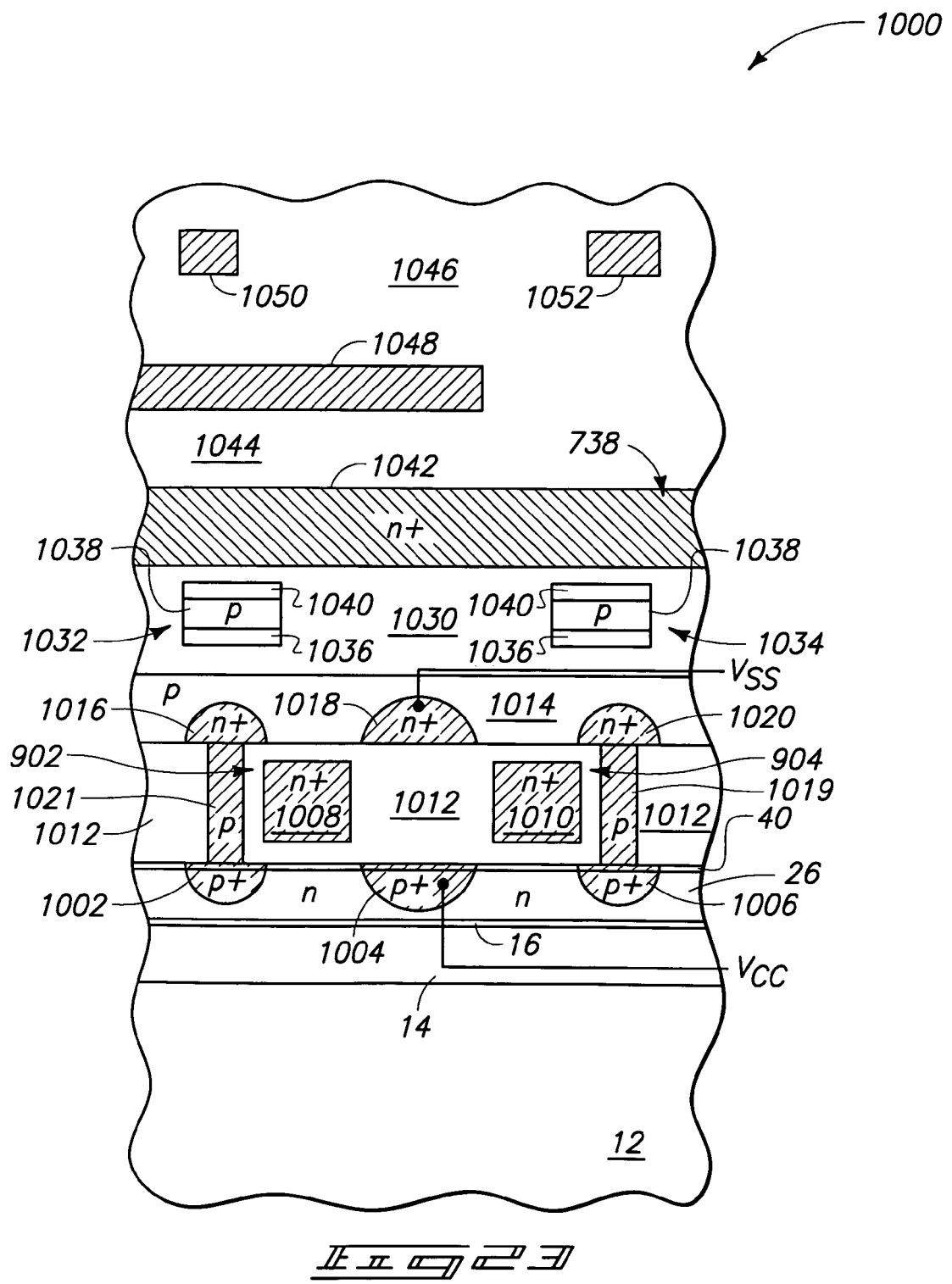
FIG. 23 is a diagrammatic, cross-sectional view of an exemplary SRAM construction that can be formed in accordance with an aspect of the present invention.

Referring next to FIG. 23, a fragment 1000 of an SRAM construction is shown in cross-sectional view. Similar numbering will be utilized to describe fragment 1000 as was used in describing FIGS. 1-22 above, where appropriate. Fragment 1000 comprises a substrate 12 and an insulative material 14 over the substrate. Substrate 12 and insulative material 14 can comprise the same materials as described previously with reference to FIG. 3.

Fragment 1000 comprises the seed layer 16, silicon/germanium layer 26 having a relaxed crystalline lattice, and layer 40 having a strained crystalline lattice that were described previously in this disclosure. The materials 26 and 40 can correspond to, for example, the materials 26 and 40 described above with reference to FIG. 11. Layer 16 can comprise, consist essentially of, or consist of doped silicon.

P-type doped diffusion regions 1002, 1004 and 1006 are formed to extend into layers 26 and 40 to serve as source/drain regions for PFET devices.

Conductive gates 1008 and 1010 are over material 40, and spaced from material 40 by an insulative material 1012. Insulative material 1012 can comprise, for example, silicon dioxide.

A semiconductive material 1014 is over gates 1008 and 1010. Semiconductive material 1014 is background doped with p-type dopant. N-type diffusion regions 1016, 1018, and 1020 extend into semiconductive material 1014 to serve as source/drain regions for NFET devices. The p+ region 1004 is isolated from the n+ region 1018 with insulative material (typically silicon dioxide) 1012, to provide isolation between the $V_{CC}$ line (711 of FIG. 22) and the ground line (715 of FIG. 22). Regions 1002 and 1016 are electrically connected through an interconnecting conductive material 1021 (and correspond to a conductive node), and regions 1020 and 1006 are electrically connected through an interconnecting conductive material 1019 (and correspond to a common node).

Gate 1008 together with source/drain regions 1002, 1004, 1016 and 1018 corresponds to a CMOS construction utilizing a common gate of the type described with reference to FIGS. 15 and 16. Similarly, gate 1010 together with source/drain regions 1004, 1006, 1018 and 1020 corresponds to a CMOS utilizing a common gate analogous to the constructions described above with reference to FIGS. 15 and 16.

The gate 1008 can be considered to be part of a first inverter comprising a first NFET device and a first PFET device, and the gate 1010 can be considered to be part of a second inverter comprising a second NFET device and a second PFET device. Specifically, gate 1008 can be considered a first transistor gate common to the first NFET and PFET devices (with the first PFET device comprising source/drain regions 1002 and 1004; and the first NFET device comprising source/drain regions 1016 and 1018). The gate 1010 can be considered to be a second transistor gate common to the second NFET and PFET devices (with the second PFET device comprising source/drain regions 1004 and 1006; and the second NFET device comprising source/drain regions 1018 and 1020). The source/drain region 1004 is a p-type region shared between the first and second PFET devices, and the source/drain region 1018 is an n-type region shared between the first and second NFET devices. In the shown construction, the first and second inverters are comprised by an SOI construction.

An insulative material 1030 is provided over semiconductive material 1014. Insulative material 1030 can comprise any suitable electrically insulative material, or combination of electrical insulative layers, and in particular aspects will comprise $SiO_2$ or borophosphosilicate glass.

Semiconductive material strips 1032 and 1034 are formed to be surrounded by insulative material 1030. Semiconductive material strips 1032 and 1034 comprise, in the shown embodiment, a seed layer 1036, a p-doped silicon/germanium layer 1038 having a relaxed crystalline lattice, and a layer 1040 having a strained crystalline lattice. Layers 1036, 1038 and 1040 thus having compositions analogous to those of the layers 16, 26 and 40 described above with reference to, for example, FIGS. 8, 9 and 11, and accordingly can be formed utilizing processing analogous to that described above. The silicon/germanium material 1038 is shown to be p-type doped, and such corresponds to background doping in the material. Lines 1032 and 1034 comprise active regions for the NFET access transistors, and ultimately source/drain regions are formed in lines 1032 and 1034. Such source/drain regions can comprise heavily n-type doped regions (not shown in the cross-section of FIG. 23 as the heavily-doped regions would be outside of the plane of the cross-section).

An n+ doped polysilicon conductive line 1042 is formed over segments 1032 and 1034, and separated from segments 1032 and 1034 by a thin gate dielectric. Ultimately, portions of line 1042 are utilized as gate stacks. Transistor devices are formed comprising common gate 1042 and source/drain regions formed within segments 1032 and 1034.

An electrically insulative material 1044 is formed over line 1042, and conductive segments 1048 corresponding to a first layer of metal (metal 1, or M1) is formed over the insulative material 1044. The material 1044 can comprise, for example, borophosphosilicate glass, $SiO_2$ or other suitable intermetallic dielectrics. Conductive lines 1050 and 1052 are formed over segment 1048. Lines 1050 and 1052 can correspond to metal 2 (M2) layers. The conductive materials of lines 1048, 1050 and 1052 can comprise any suitable conductive material, including, for example, metal, metal compound, and/or conductively-doped silicon. Insulator 1046 separates the metal 1 layer from the metal 2 layers.

The construction 1000 of FIG. 23 can be utilized in forming a stacked SRAM device analogous to that described above with reference to FIG. 22. Specifically, gates 1008 and 1010 can be formed corresponding to the lines 902 and 904, respectively. Accordingly, p+ source/drain region 1004 can correspond to the region 912 of FIG. 22, and can be connected to $V_{CC}$. Similarly, n+ source/drain region 1018 can correspond to the region 910 of FIG. 22, and can be connected with $V_{SS}$. The regions 1002, 1016 and a not shown n+ region for 1032 correspond to common node 731, while the regions 1006, 1020 and a not shown n+ diffusion region for 1034 correspond to common node 733.

The line 1042 can correspond to wordline 738 of FIG. 22 and the segments 1032 and 1034 can correspond to the active regions for the access transistors 730 and 732.

The segment 1048 corresponds to any of the metal 1 components of FIG. 22, including, for example, the $V_{SS}$ (or ground) line 715, the $V_{CC}$ line 711, the interconnect 726, or the interconnect 724, for example.

The segments 1050 and 1052 can correspond to bitlines 734 and 736.

Utilization of a Si/Ge layer can improve performance of the devices of the present invention relative to prior art devices having source/drain regions extending into materials consisting of conductively-doped silicon. The performance of the devices can be further enhanced by utilizing a layer having a relaxed crystalline lattice in combination with a layer having a strained crystalline lattice for reasons such as those discussed above with reference to FIGS. 1-9.

The various concepts described herein can be utilized to, among other things, achieve high density of memory devices, reduce costs associated with memory device fabrication, reduce power consumption of memory devices, and enable fabrication of high performance SRAM designs on a variety of substrates.

Several of the figures show various different dopant levels, and utilize the designations p+, p, p−, n−, n and n+ to distinguish the levels. The difference in dopant concentration between the regions identified as being p+, p, and p− are typically as follows. A p+ region has a dopant concentration of at least about $10^{20}$ atoms/cm$^3$, a p region has a dopant concentration of from about $10^{14}$ to about $10^{18}$ atoms/cm$^3$, and a p− region has a dopant concentration in the order of or less than $10^{16}$ atoms/cm$^3$. It is noted that regions identified as being n−, n and n+ will have dopant concentrations similar to those described above relative to the p−, p and p+ regions respectively, except, of course, the n regions will have an opposite-type conductivity enhancing dopant therein than do the p regions.

The p+, p, and p− dopant levels are shown in the drawings only to illustrate differences in dopant concentration. It is noted that the term "p" is utilized herein to refer to both a dopant type and a relative dopant concentration. To aid in interpretation of this specification and the claims that follow, the term "p" is to be understood as referring only to dopant type, and not to a relative dopant concentration, except when it is explicitly stated that the term "p" refers to a relative dopant concentration. Accordingly, for purposes of interpreting this disclosure and the claims that follow, it is to be understood that the term "p-type doped" refers to a dopant type of a region and not a relative dopant level. Thus, a p-type doped region can be doped to any of the p+, p, and p− dopant levels discussed above. Similarly, an n-type doped region can be doped to any of the n+, n, and n− dopant levels discussed above.

Figure 24:
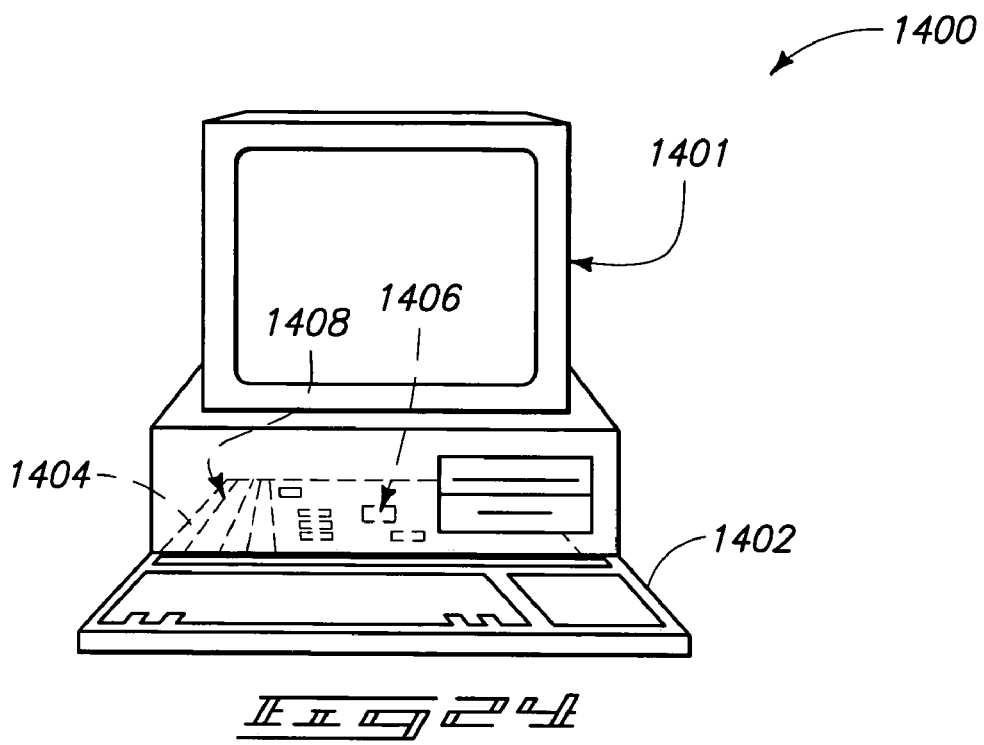
FIG. 24 is a diagrammatic view of a computer illustrating an exemplary application of the present invention.
Figure 25:
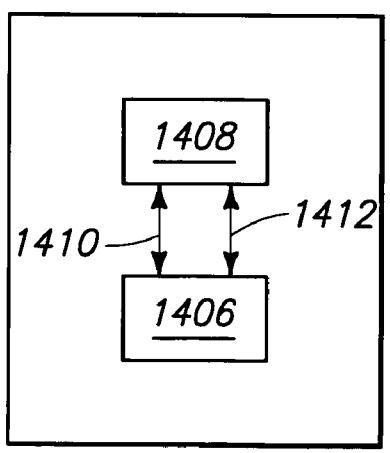
FIG. 25 is a block diagram showing particular features of the motherboard of the FIG. 24 computer.

FIG. 24 illustrates generally, by way of example, but not by way of limitation, an embodiment of a computer system 1400 according to an aspect of the present invention. Computer system 1400 includes a monitor 1401 or other communication output device, a keyboard 1402 or other communication input device, and a motherboard 1404. Motherboard 1404 can carry a microprocessor 1406 or other data processing unit, and at least one memory device 1408. Memory device 1408 can comprise various aspects of the invention described above, including, for example, one or more of the SRAM cells described with reference to FIGS. 19-23. Memory device 1408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 1408 and processor 1406. Such is illustrated in the block diagram of the motherboard 1404 shown in FIG. 25. In such block diagram, the addressing circuitry is illustrated as 1410 and the read circuitry is illustrated as 1412. Various components of computer system 1400, including processor 1406, can comprise one or more of the SRAM constructions described with reference to FIGS. 19-23.

In particular aspects of the invention, processor device 1406 can correspond to a processor module, and associated random logic may be used in the implementation utilizing the teachings of the present invention.

In particular aspects of the invention, memory device 1408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

FIG. 26 illustrates a simplified block diagram of a high-level organization of various embodiments of an exemplary electronic system 1700 of the present invention. System 1700 can correspond to, for example, a computer system, a process control system, or any other system that employs a processor and associated memory. Electronic system 1700 has functional elements, including a processor or arithmetic/logic unit (ALU) 1702, a control unit 1704, a memory device unit 1706 and an input/output (I/O) device 1708. Generally, electronic system 1700 will have a native set of instructions that specify operations to be performed on data by the processor 1702 and other interactions between the processor 1702, the memory device unit 1706 and the I/O devices 1708. The control unit 1704 coordinates all operations of the processor 1702, the memory device 1706 and the I/O devices 1708 by continuously cycling through a set of operations that cause instructions to be fetched from the memory device 1706 and executed. In various embodiments, the memory device 1706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include SRAM cells, DRAM cells and/or logic constructions in accordance with various aspects of the present invention.

FIG. 27 is a simplified block diagram of a high-level organization of various embodiments of an exemplary electronic system 1800. The system 1800 includes a memory device 1802 that has an array of memory cells 1804, address decoder 1806, row access circuitry 1808, column access circuitry 1810, read/write control circuitry 1812 for controlling operations, and input/output circuitry 1814. The memory device 1802 further includes power circuitry 1816, and sensors 1820, such as current sensors for determining whether a memory cell is in a low-threshold conducting state or in a high-threshold non-conducting state. The illustrated power circuitry 1816 includes power supply circuitry 1880, circuitry 1882 for providing a reference voltage, circuitry 1884 for providing the first wordline with pulses, circuitry 1886 for providing the second wordline with pulses, and circuitry 1888 for providing the bitline with pulses. The system 1800 also includes a processor 1822, or memory controller for memory accessing.

The memory device 1802 receives control signals 1824 from the processor 1822 over wiring or metallization lines. The memory device 1802 is used to store data which is accessed via I/O lines. It will be appreciated by those skilled in the art that additional circuitry and control signals can be provided, and that the memory device 1802 has been simplified to help focus on the invention. At least one of the processor 1822 or memory device 1802 can include an SRAM cell and/or random logic construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells and logic constructions can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An SRAM construction comprising:
a substrate;
an electrically insulative layer over the substrate;
a first silicon/germanium layer over the electrically insulative layer, the first silicon/germanium layer being background n-type doped and having a relaxed crystalline lattice;
a second silicon/germanium layer over and directly against the first silicon/germanium layer, the second silicon/germanium layer being background n-type doped and comprising a strained crystalline lattice;
three p-type doped diffusion regions extending through the second silicon/germanium layer and into the first silicon/germanium layer; the three p-type doped diffusion regions being laterally spaced from one another, and being a first p-type diffusion region, a second p-type diffusion region and a third p-type diffusion region, respectively;
a first gate electrode above the p-type diffusion regions, and gatedly coupling the first and second p-type diffusion regions to one another, the first gate electrode comprising n-type doped silicon;
a second gate electrode above the p-type diffusion regions, and gatedly coupling the second and third p-type diffusion regions to one another, the second gate electrode comprising n-type doped silicon;
a background p-type doped semiconductor layer over the first and second gate electrodes;
three n-type doped diffusion regions over the first and second gate electrodes and extending upwardly into the background p-type doped semiconductor layer; the three n-type doped diffusion regions being laterally spaced from one another, and being a first n-type diffusion region, a second n-type diffusion region and a third n-type diffusion region, respectively; the first and second n-type diffusion regions being gatedly coupled to one another by the first gate electrode, and the second and third n-type diffusion regions being gatedly coupled to one another by the second gate electrode; the first, second and third n-type diffusion regions being directly over the first, second and third p-type diffusion regions, respectively;
a first p-type doped electrical interconnect electrically connecting the first p-type diffusion region and first n-type diffusion region to one another; and
a second p-type doped electrical interconnect electrically connecting the second p-type diffusion region and third n-type diffusion region to one another.

2. The SRAM construction of claim 1 wherein the substrate comprises a semiconductive material.

3. The SRAM construction of claim 1 wherein the substrate comprises glass.

4. The SRAM construction of claim 1 wherein the substrate comprises aluminum oxide.

5. The SRAM construction of claim 1 wherein the substrate comprises silicon dioxide.

6. The SRAM construction of claim 1 wherein the substrate comprises a metal.

7. An SRAM construction comprising:
a substrate;
an electrically insulative layer over the substrate;
a first silicon/germanium layer over the electrically insulative layer, the first silicon/germanium layer being background n-type doped and having a relaxed crystalline lattice;
a second silicon/germanium layer over and directly against the first silicon/germanium layer, the second silicon/germanium layer being background n-type doped and comprising a strained crystalline lattice;

three p-type doped diffusion regions extending through the second silicon/germanium layer and into the first silicon/germanium layer; the three p-type doped diffusion regions being laterally spaced from one another, and being a first p-type diffusion region, a second p-type diffusion region and a third p-type diffusion region, respectively;

a first gate electrode above the p-type diffusion regions, and gatedly coupling the first and second p-type diffusion regions to one another, the first gate electrode comprising n-type doped silicon;

a second gate electrode above the p-type diffusion regions, and gatedly coupling the second and third p-type diffusion regions to one another, the second gate electrode comprising n-type doped silicon;

a background p-type doped semiconductor layer over the first and second gate electrodes;

three n-type doped diffusion regions over the first and second gate electrodes and extending upwardly into the background p-type doped semiconductor layer; the three n-type doped diffusion regions being laterally spaced from one another, and being a first n-type diffusion region, a second n-type diffusion region and a third n-type diffusion region, respectively; the first and second n-type diffusion regions being gatedly coupled to one another by the first gate electrode, and the second and third n-type diffusion regions being gatedly coupled to one another by the second gate electrode; the first, second and third n-type diffusion regions being directly over the first, second and third p-type diffusion regions, respectively;

a first p-type doped electrical interconnect electrically connecting the first p-type diffusion region and first n-type diffusion region to one another;

a second p-type doped electrical interconnect electrically connecting the second p-type diffusion region and third n-type diffusion region to one another; and wherein the substrate comprises a plastic.

8. An SRAM construction comprising:

a substrate;

an electrically insulative layer over the substrate;

a first silicon/germanium layer over the electrically insulative layer, the first silicon/germanium layer being background n-type doped and having a relaxed crystalline lattice;

a second silicon/germanium layer over and directly against the first silicon/germanium layer, the second silicon/germanium layer being background n-type doped and comprising a strained crystalline lattice;

three p-type doped diffusion regions extending through the second silicon/germanium layer and into the first silicon/germanium layer; the three p-type doped diffusion regions being laterally spaced from one another, and being a first p-type diffusion region, a second p-type diffusion region and a third p-type diffusion region, respectively;

a first gate electrode above the p-type diffusion regions, and gatedly coupling the first and second p-type diffusion regions to one another, the first gate electrode comprising n-type doped silicon;

a second gate electrode above the p-type diffusion regions, and gatedly coupling the second and third p-type diffusion regions to one another, the second gate electrode comprising n-type doped silicon;

a background p-type doped semiconductor layer over the first and second gate electrodes;

three n-type doped diffusion regions over the first and second gate electrodes and extending upwardly into the background p-type doped semiconductor layer; the three n-type doped diffusion regions being laterally spaced from one another, and being a first n-type diffusion region, a second n-type diffusion region and a third n-type diffusion region, respectively; the first and second n-type diffusion regions being gatedly coupled to one another by the first gate electrode, and the second and third n-type diffusion regions being gatedly coupled to one another by the second gate electrode; the first, second and third n-type diffusion regions being directly over the first, second and third p-type diffusion regions, respectively;

a first p-type doped electrical interconnect electrically connecting the first p-type diffusion region and first n-type diffusion region to one another;

a second p-type doped electrical interconnect electrically connecting the second p-type diffusion region and third n-type diffusion region to one another; and wherein the first p-type doped electrical interconnect extends vertically from the first p-type diffusion region to the first n-type diffusion region.

9. An SRAM construction comprising:

a substrate;

an electrically insulative layer over the substrate;

a first silicon/germanium layer over the electrically insulative layer, the first silicon/germanium layer being background n-type doped and having a relaxed crystalline lattice;

a second silicon/germanium layer over and directly against the first silicon/germanium layer, the second silicon/germanium layer being background n-type doped and comprising a strained crystalline lattice;

three p-type doped diffusion regions extending through the second silicon/germanium layer and into the first silicon/germanium layer; the three p-type doped diffusion regions being laterally spaced from one another, and being a first p-type diffusion region, a second p-type diffusion region and a third p-type diffusion region, respectively;

a first gate electrode above the p-type diffusion regions, and gatedly coupling the first and second p-type diffusion regions to one another, the first gate electrode comprising n-type doped silicon;

a second gate electrode above the p-type diffusion regions, and gatedly coupling the second and third p-type diffusion regions to one another, the second gate electrode comprising n-type doped silicon;

a background p-type doped semiconductor layer over the first and second gate electrodes;

three n-type doped diffusion regions over the first and second gate electrodes and extending upwardly into the background p-type doped semiconductor layer; the three n-type doped diffusion regions being laterally spaced from one another, and being a first n-type diffusion region, a second n-type diffusion region and a third n-type diffusion region, respectively; the first and second n-type diffusion regions being gatedly coupled to one another by the first gate electrode, and the second and third n-type diffusion regions being gatedly coupled to one another by the second gate electrode; the first, second and third n-type diffusion regions being directly over the first, second and third p-type diffusion regions, respectively;

a first p-type doped electrical interconnect electrically connecting the first p-type diffusion region and first n-type diffusion region to one another;

a second p-type doped electrical interconnect electrically connecting the second p-type diffusion region and third n-type diffusion region to one another; and wherein the second p-type doped electrical interconnect extends vertically from the third p-type diffusion region to the third n-type diffusion region.

10. A electronic system, comprising:

one or more SRAM devices;

addressing circuitry coupled to the SRAM devices for accessing the SRAM devices;

a read circuit coupled to the SRAM devices for reading data from the SRAM devices; and wherein at least one of the SRAM devices is part of a construction comprising:

a substrate;

an electrically insulative layer over the substrate;

a first silicon/germanium layer over the electrically insulative layer, the first silicon/germanium layer being background n-type doped and having a relaxed crystalline lattice;

a second silicon/germanium layer over and directly against the first silicon/germanium layer, the second silicon/germanium layer being background n-type doped and comprising a strained crystalline lattice;

three p-type doped diffusion regions extending through the second silicon/germanium layer and into the first silicon/germanium layer; the three p-type doped diffusion regions being laterally spaced from one another, and being a first p-type diffusion region, a second p-type diffusion region and a third p-type diffusion region, respectively;

a first gate electrode above the p-type diffusion regions, and gatedly coupling the first and second p-type diffusion regions to one another, the first gate electrode comprising n-type doped silicon;

a second gate electrode above the p-type diffusion regions, and gatedly coupling the second and third p-type diffusion regions to one another, the second gate electrode comprising n-type doped silicon;

a background p-type doped semiconductor layer over the first and second gate electrodes;

three n-type doped diffusion regions over the first and second gate electrodes and extending upwardly into the background p-type doped semiconductor layer; the three n-type doped diffusion regions being laterally spaced from one another, and being a first n-type diffusion region, a second n-type diffusion region and a third n-type diffusion region, respectively; the first and second n-type diffusion regions being gatedly coupled to one another by the first gate electrode, and the second and third n-type diffusion regions being gatedly coupled to one another by the second gate electrode; the first, second and third n-type diffusion regions being directly over the first, second and third p-type diffusion regions, respectively;

a first p-type doped electrical interconnect extending vertically from the third p-type diffusion region to the third n-type region; and a second p-type doped electrical interconnect extending vertically from the third p-type diffusion region to the third n-type diffusion region.

11. The electronic system of claim 10 wherein the substrate comprises a semiconductive material.

12. The electronic system of claim 10 wherein the substrate comprises glass.

13. The electronic system of claim 10 wherein the substrate comprises aluminum oxide.

14. The electronic system of claim 10 wherein the substrate comprises silicon dioxide.

15. The electronic system of claim 10 wherein the substrate comprises a metal.

16. The electronic system of claim 10 wherein the substrate comprises a plastic.

* * * * *

UNITED STATES PATENT AND TRADEMARK OFFICE
CERTIFICATE OF CORRECTION

PATENT NO. : 7,432,562 B2
APPLICATION NO. : 11/398216
DATED : October 7, 2008
INVENTOR(S) : Bhattacharyya Page 1 of 1

It is certified that error appears in the above-identified patent and that said Letters Patent is hereby corrected as shown below:

In column 30, line 45, in Claim 1, delete "second" and insert -- third --, therefor.

In column 31, line 36, in Claim 7, delete "second" and insert -- third --, therefor.

In column 32, line 19, in Claim 8, delete "second" and insert -- third --, therefor.

In column 33, line 5, in Claim 9, delete "second" and insert -- third --, therefor.

In column 34, line 23, in Claim 10, delete "third" and insert -- first --, therefor.

In column 34, line 24, in Claim 10, delete "third" and insert -- first --, therefor.

In column 34, line 24, in Claim 10, after "type" insert -- diffusion --.

Signed and Sealed this

Tenth Day of March, 2009

JOHN DOLL
*Acting Director of the United States Patent and Trademark Office*